US012765005B2

United States Patent

(12) United States Patent
Seol et al.

(10) Patent No.: US 12,765,005 B2
(45) Date of Patent: Oct. 13, 2026

(54) SEMICONDUCTOR DEVICE AND METHOD OF MANUFACTURING THE SAME

(71) Applicant: Samsung Electronics Co., Ltd., Suwon-si (KR)

(72) Inventors: Minsu Seol, Suwon-si (KR); Jeeeun Yang, Suwon-si (KR); Sangwook Kim, Suwon-si (KR); Kyung-Eun Byun, Suwon-si (KR); Eunkyu Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 365 days.

(21) Appl. No.: 18/515,102

(22) Filed: Nov. 20, 2023

(65) Prior Publication Data

US 2024/0234557 A1 Jul. 11, 2024

(30) Foreign Application Priority Data

Jan. 11, 2023 (KR) ........................ 10-2023-0004290

(51) Int. Cl.
*H01L 29/76* (2006.01)
*H10D 48/36* (2025.01)
(Continued)

(52) U.S. Cl.
CPC ........... *H10D 48/362* (2025.01); *H10D 62/80* (2025.01); *H10D 64/513* (2025.01); *H10D 99/00* (2025.01); *H10P 14/3436* (2026.01)

(58) Field of Classification Search
CPC .... H10D 48/362; H10D 62/80; H10D 64/513; H10D 99/00; H10D 30/6757;
(Continued)

(56) References Cited

U.S. PATENT DOCUMENTS 7,968,674 B2 6/2011 Choi et al.
7,988,941 B2 8/2011 Choi et al.
(Continued)

FOREIGN PATENT DOCUMENTS

CN 110473906 A 11/2019
CN 113421915 A 9/2021
(Continued)

OTHER PUBLICATIONS

Extended European Search Report dated Jun. 19, 2024 issued in European Patent Application No. 24150358.0-1001.

*Primary Examiner* — Mohammed R Alam
(74) *Attorney, Agent, or Firm* — Harness, Dickey & Pierce, P.L.C.

(57) ABSTRACT

Disclosed are a semiconductor device, a method of manufacturing the same, and an electronic element and an electronic apparatus each including the semiconductor device. The semiconductor device may include a substrate, a channel layer on the substrate, a first electrode and a second electrode on two opposite ends of the channel layer, respectively, and spaced apart from each other, a gate electrode on the channel layer and spaced apart from the first electrode and the second electrode, a gate dielectric material provided between the channel layer and the gate electrode, and a chalcogen compound layer being at least one of between the gate dielectric material and the channel layer, between the first electrode and the channel layer, and between the second electrode and the channel layer.

15 Claims, 27 Drawing Sheets

(51) Int. Cl.

| | |
|---|---|
| ***H10D 62/80*** | (2025.01) |
| ***H10D 64/27*** | (2025.01) |
| ***H10D 99/00*** | (2025.01) |
| ***H10P 14/20*** | (2026.01) |

(58) Field of Classification Search

CPC .. H10D 30/62; H10D 30/6728; H10D 30/675; H10D 30/6755; H10D 62/10; H10D 30/60; H10D 62/124; H10D 64/20; H10D 30/6704; H10P 14/3436; H10B 12/05

See application file for complete search history.

(56) References Cited

U.S. PATENT DOCUMENTS

| | | | | |
|---|---|---|---|---|
| 8,133,466 | B2 | 3/2012 | Shin et al. | |
| 8,283,038 | B2 | 10/2012 | Choi et al. | |
| 8,535,553 | B2 | 9/2013 | Kong et al. | |
| 8,623,761 | B2 | 1/2014 | Bonilla et al. | |
| 8,723,024 | B2 | 5/2014 | Choi et al. | |
| 8,895,433 | B2 | 11/2014 | Bonilla et al. | |
| 8,906,787 | B2 | 12/2014 | Park et al. | |
| 8,912,530 | B2 | 12/2014 | Yang et al. | |
| 9,040,957 | B2 | 5/2015 | Lee et al. | |
| 9,056,424 | B2 | 6/2015 | Wenxu et al. | |
| 9,064,777 | B2 | 6/2015 | Heo et al. | |
| 9,082,793 | B1 | 7/2015 | Ahmed | |
| 9,108,848 | B2 | 8/2015 | Woo et al. | |
| 9,293,603 | B2 | 3/2016 | Yang et al. | |
| 9,324,634 | B2 | 4/2016 | Bao et al. | |
| 9,324,635 | B2 | 4/2016 | Bao et al. | |
| 9,359,211 | B2 | 6/2016 | Woo et al. | |
| 9,472,450 | B2 | 10/2016 | Bonilla et al. | |
| 9,527,043 | B2 | 12/2016 | Choi et al. | |
| 9,533,265 | B2 | 1/2017 | Choi et al. | |
| 9,559,215 | B1 | 1/2017 | Ahmed et al. | |
| 9,583,358 | B2 | 2/2017 | Kim et al. | |
| 9,721,734 | B2 | 8/2017 | Ryu et al. | |
| 10,325,987 | B2 | 6/2019 | Park et al. | |
| 10,680,115 | B2 | 6/2020 | Ahmed et al. | |
| 11,171,239 | B2 | 11/2021 | Naylor et al. | |
| 2011/0127471 | A1 | 6/2011 | Shin et al. | |
| 2013/0059155 | A1 | 3/2013 | Choi et al. | |
| 2014/0087191 | A1 | 3/2014 | Chua et al. | |
| 2015/0179815 | A1 | 6/2015 | Ahmed | |
| 2015/0235959 | A1 | 8/2015 | Lee et al. | |
| 2019/0074381 | A1* | 3/2019 | Park | H10D 30/6757 |
| 2019/0123149 | A1 | 4/2019 | Lee et al. | |
| 2020/0357929 | A1 | 11/2020 | Le et al. | |
| 2022/0102499 | A1 | 3/2022 | Naylor et al. | |
| 2022/0246766 | A1 | 8/2022 | Manfrini et al. | |
| 2022/0293735 | A1* | 9/2022 | Wang | H10D 62/307 |
| 2023/0088634 | A1* | 3/2023 | Lin | H10D 30/031 257/288 |

FOREIGN PATENT DOCUMENTS

| | | | |
|---|---|---|---|
| KR | 2022-0057511 | A | 5/2022 |
| WO | WO-2018/009931 | A1 | 1/2018 |
| WO | 2019/005074 | A1 | 1/2019 |

* cited by examiner

SEMICONDUCTOR DEVICE AND METHOD OF MANUFACTURING THE SAME

CROSS-REFERENCE TO RELATED APPLICATION

This application claims the benefit of Korean Patent Application No. 10-2023-0004290, filed on Jan. 11, 2023, in the Korean Intellectual Property Office, the disclosure of which is incorporated herein in its entirety by reference.

BACKGROUND

1. Field

The disclosure relates to switching devices, and more particularly, to semiconductor devices and/or methods of manufacturing the same.

2. Description of the Related Art

Transistors, which are semiconductor devices for electrical switching, are employed in various integrated circuit (IC) devices including memories, driving ICs, logic elements, and the like. In order to increase the degree of integrity of IC devices, space occupied by transistors included in the IC devices is rapidly reducing, and thus research for maintaining performance while reducing the size of a transistor has been conducted.

One of the important portions in the transistor is a gate electrode. When a voltage is applied to the gate electrode, a channel adjacent to a gate opens a current path, and in a reverse case, blocks the current. Semiconductor performance may be improved by reducing leakage current in the gate electrode and the channel and efficiently managing the leakage current. The power efficiency of the transistor increases as the area in which the gate electrode controlling the current contacts the channel increases.

As a semiconductor process is further refined, the size of a transistor decreases, and the area in which the gate electrode contacts the channel decreases, which causes issues such as a short channel effect. For example, there are phenomena such as a threshold voltage variation, a carrier velocity saturation, or the deterioration of subthreshold characteristics. Accordingly, it is necessary to reduce the channel length while effectively overcome the short channel effect.

SUMMARY

One or more example embodiments provide semiconductor devices having a relatively low contact resistance.

One or more example embodiments provide semiconductor devices with increased carrier movement speed.

One or more example embodiments provide semiconductor devices with reduced heat generated in an operation process.

One or more example embodiments provide methods of manufacturing the semiconductor device.

One or more example embodiments provide electronic elements including the semiconductor device.

One or more example embodiments provide electronic apparatuses including the semiconductor device.

One or more example embodiments provide electronic apparatuses including the electronic element.

Additional aspects will be set forth in part in the description which follows and will be apparent from the description, or may be learned by practice of the presented example embodiments.

According to an aspect of the disclosure, a semiconductor device may include a substrate, a channel layer on the substrate, a first electrode and a second electrode one two opposite ends of the channel layer, respectively, and spaced apart from each other, a gate electrode on the channel layer and spaced apart from the first electrode and the second electrode, a gate dielectric material between the channel layer and the gate electrode, and a chalcogen compound layer being at least one of between the gate dielectric material and the channel layer, between the first electrode and the channel layer, and between the second electrode and the channel layer.

The chalcogen compound layer may include a portion of the channel layer that is doped with a chalcogen element.

The channel layer may include at least one of indium (In), zinc (Zn), tin (Sn), gallium (Ga), and hafnium (Hf).

A mass percentage of the chalcogen element in the chalcogen compound layer may be 5 wt % or more and 20 wt % or less.

The chalcogen compound layer may include a two-dimensional transition metal dichalcogenide compound.

The two-dimensional transition metal dichalcogenide compound may include one metal element selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb) and one chalcogen element selected from the group consisting of sulfur (S), selenium (Se), and tellurium (Te).

The two-dimensional transition metal dichalcogenide compound may include at least one atomic layer, and the number of the at least one atomic layer may be 1 or more and 10 or less.

The thickness of the chalcogen compound layer may be 1 nm or more and 5 nm or less.

The channel layer, the gate dielectric material, and the gate electrode may be stacked in a direction perpendicular to the substrate.

The gate electrode have a shape in which the height may be greater than the width.

The channel layer, the gate dielectric material, and the gate electrode may be stacked in a direction parallel to the substrate.

The substrate may include a trench, the gate dielectric material may be cover a bottom surface and side walls of the trench, and the gate electrode may be surrounded by the gate dielectric material in the trench.

According to another aspect of the disclosure, a method of manufacturing a semiconductor device may include forming a channel layer in a substrate, forming a chalcogen compound layer in the channel layer, forming a gate dielectric material, forming a first electrode and a second electrode spaced apart from each other, and forming a gate electrode on the gate dielectric material to be spaced apart from the first electrode and the second electrode, wherein the chalcogen compound layer is formed in at least one of between the gate dielectric material and the channel layer, between the first electrode and the channel layer, and between the second electrode and the channel layer.

The chalcogen compound layer may include a portion of the channel layer that is doped with a chalcogen element.

The channel layer may include at least one of indium (In), zinc (Zn), tin (Sn), gallium (Ga), and hafnium (Hf).

A mass percentage of the chalcogen element in the chalcogen compound layer may be 5 wt % or more and 20 wt % or less.

The chalcogen compound layer may include a two-dimensional transition metal dichalcogenide compound.

The two-dimensional transition metal dichalcogenide compound may include one metal element selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb) and one chalcogen element selected from the group consisting of sulfur (S), selenium (Se), and tellurium (Te).

The two-dimensional transition metal dichalcogenide compound may include at least one atomic layer, and the number of the at least one atomic layer may be 1 or more and 10 or less.

The thickness of the chalcogen compound layer may be 1 nm or more and 5 nm or less.

BRIEF DESCRIPTION OF THE DRAWINGS

One or more aspects of the present disclosure will become apparent and more readily appreciated from the following description of some example embodiments, taken in conjunction with the accompanying drawings in which.

DETAILED DESCRIPTION

Figure 1:
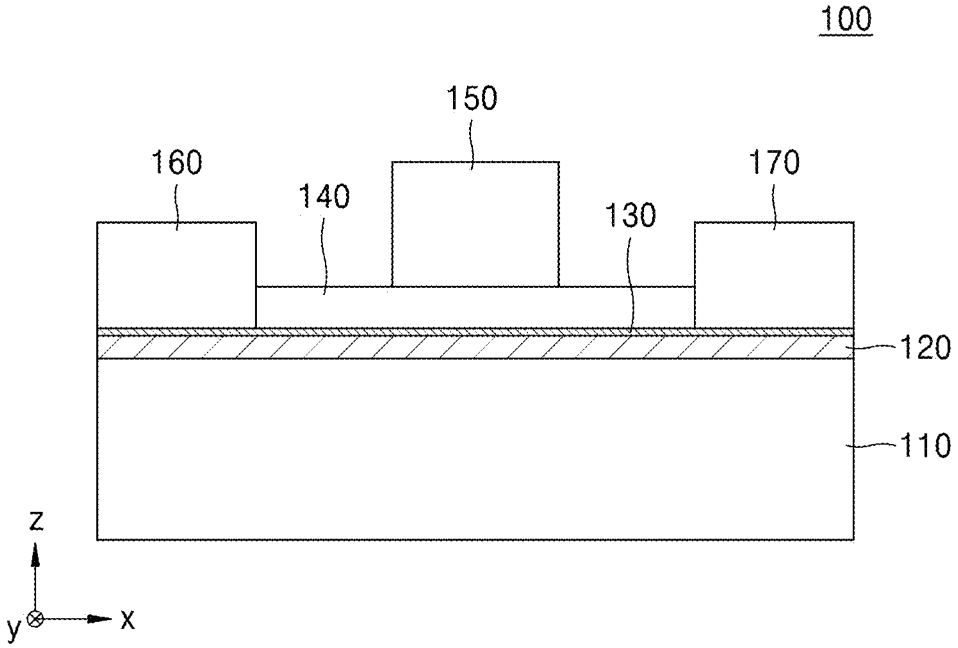
FIG. 1 is a cross-sectional view of a semiconductor device according to an example embodiment.

Reference will now be made in detail to some example embodiments, which are illustrated in the accompanying drawings, wherein like reference numerals refer to like elements throughout. In this regard, the disclosed example embodiments may have different forms and should not be construed as being limited to the descriptions set forth herein. Accordingly, the disclosed example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, semiconductor devices according to some example embodiment, manufacturing methods thereof, and/or an electronic elements and an electronic apparatuses, both including the semiconductor device manufactured by the method, are described below in detail with reference to the accompanying drawings. In the drawings, widths and thicknesses of layers or regions may be exaggerated to a degree for clarity of the specification and for convenience of description.

While some example embodiments described below are examples, other modifications may be produced from the disclosed example embodiments. Furthermore, in a layer structure, when a constituent element is disposed "above" or "on" to another constituent element, the constituent element may be directly on the other constituent element or above the other constituent elements in a non-contact manner.

The expression of singularity in the specification includes the expression of plurality unless clearly specified otherwise in context. It will be further understood that the terms "comprises" and/or "comprising" used herein specify the presence of stated features or components, but do not preclude the presence or addition of one or more other features or components.

The use of the terms "a" and "an" and "the" and similar referents in the context of describing the disclosure are to be construed to cover both the singular and the plural. Also, the steps of all methods described herein can be performed in any suitable order unless otherwise indicated herein or otherwise clearly contradicted by context. The disclosure is not limited to the described order of the steps.

Furthermore, terms such as " . . . portion," " . . . unit," " . . . module," and " . . . block" stated in the specification may signify a unit configured to process at least one function or operation and the unit may be embodied by hardware, software, or a combination of hardware and software.

Furthermore, connection lines or connection members between the constituent elements shown in the drawings are merely illustrative of functional connections and/or physical or circuit connections. In an actual device, a connection between the constituent elements may be indicated by various functional connections, physical connections, or circuit connections that can be replaced or added.

The use of any and all examples, or language (e.g., "such as") provided herein, is intended merely to better illuminate the disclosure and does not pose a limitation on the scope of the disclosure unless otherwise claimed.

FIG. 1 is a cross-sectional view of a semiconductor device 100 according to an example embodiment. The semiconductor device 100 may include a field effect transistor (FET).

Referring to FIG. 1, the semiconductor device 100 includes a substrate 110, a channel layer 120, a first electrode 160 and a second electrode 170 provided in one end and the opposite end (e.g., on two opposite ends) of the channel layer 120, respectively and spaced apart from each other, and a gate electrode 150 provided above the channel layer

120 and spaced part from the first electrode 160 and the second electrode 170, a gate dielectric material 140 provided between the channel layer 120 and the gate electrode 150, and a chalcogen compound layer 130 provided between the gate dielectric material 140 and the channel layer 120 and between each of the first and second electrodes 160 and 170 and the channel layer 120, but the disclosure is not limited thereto.

The channel layer 120 may be provided on one surface of the substrate 110. In one or more example embodiments, one surface of the substrate 110 may be provided on a plane (X-Y plane) formed by an x-axis and a y-axis. In one or more example embodiments, although the one surface of the substrate 110 may be expressed as an upper portion of the substrate 110, the one surface of the substrate 110 may also be expressed as a bottom surface, a side surface, or an inclined surface depending on the point of view.

The channel layer 120 may include at least one of indium (In), zinc (Zn), tin (Sn), gallium (Ga), and hafnium (Hf). In one or more example embodiments, the channel layer 120 may include a material selected from the group consisting of InGaZnO, ZnO, ZrInZnO, InZnO, ZnO, $InGaZnO_4$, ZnInO, ZnSnO, $In_2O_3$, $Ga_2O_3$, HfInZnO, GaInZnO, $HfO_2$, $SnO_2$, $WO_3$, $TiO_2$, $Ta_2O_5$, $In_2O_3SnO_2$, MgZnO, $ZnSnO_3$, $ZnSnO_4$, CdZnO, $CuAlO_2$, $CuGaO_2$, $Nb_2O_5$, $TiSrO_3$, a zinc indium oxide (ZIO), an indium gallium oxide (IGO), and a combination thereof. In one or more example embodiments, the channel layer 120 may be a monolayer or a multilayer (stacked with a plurality of monolayers).

The first and second electrodes 160 and 170 may be expressed as first and second electrode layers, or variously expressed as, for example, first and second conductive layers, first and second terminals, first and second terminal layers, and the like. One of the first and second electrodes 160 and 170 may be a source electrode (layer), and the other may be a drain electrode (layer). The first and second electrodes 160 and 170 both may be provided on the channel layer 120. One of the first and second electrodes 160 and 170 may be provided in an edge of one side of the channel layer 120, and the other may be provided in an edge of the other side thereof. The substrate 110, the channel layer 120, the chalcogen compound layer 130, and the first electrode 160 may form a layer structure sequentially stacked in a z-axis direction, and the substrate 110, the channel layer 120, the chalcogen compound layer 130, and the second electrode 170 may form a layer structure sequentially stacked in the z-axis direction.

In one or more example embodiments, the first electrode 160 and the second electrode 170 may be a composite electrode including at least two types of materials or elements. In one or more example embodiments, the first electrode 160 and the second electrode 170 may include at least one selected from the group consisting of tungsten (W), cobalt (Co), nickel (Ni), iron (Fe), titanium (Ti), molybdenum (Mo), chromium (Cr), zirconium (Zr), hafnium (Hf), niobium (Nb), tantalum (Ta), silver (Ag), gold (Au), aluminum (Al), copper (Cu), antimony (Sb), vanadium (V), ruthenium (Ru), platinum (Pt), zinc (Zn), and magnesium (Mg).

The gate electrode 150 is disposed on the channel layer 120 and spaced apart from the first and second electrodes 160 and 170. In one or more example embodiments, the material of the gate electrode 150 may be the same as or different from those of the first and second electrodes 160 and 170. The gate electrode 150 may be expressed as a third electrode.

The gate dielectric material 140 may be provided between the gate electrode 150 and the channel layer 120. The gate dielectric material 140 may include an insulating material. For example, the gate dielectric material 140 may include a dielectric. In one or more example embodiments, the gate dielectric material 140 may include a high-k material, such as aluminum oxide, hafnium oxide, titanium oxide, and the like, but the disclosure is not limited thereto. The channel layer 120, the gate dielectric material 140, and the gate electrode 150 may form, on the substrate 110, a layer structure sequentially stacked in the z-axis direction.

The chalcogen compound layer 130 may be provided on one surface of the channel layer 120, may be in contact with the one surface of the channel layer 120, and may entirely cover the one surface of the channel layer 120. In one or more example embodiments, the one surface of the channel layer 120 may be provided on the plane (the X-Y plane) consisting of the x-axis and the y-axis. In one or more example embodiments, although the one surface of the channel layer 120 may be expressed as an upper portion of the channel layer 120, the one surface of the channel layer 120 may also be expressed as a bottom surface, a side surface, or an inclined surface, depending on the point of view. As an example, the chalcogen compound layer 130 may be provided between the gate dielectric material 140 and the channel layer 120, between the first electrode 160 and the channel layer 120, and between the second electrode 170 and the channel layer 120. The thickness of the chalcogen compound layer 130 may be 1 nm or more and 5 nm or less, but the disclosure is not limited thereto.

In one or more example embodiments, the chalcogen compound layer 130 may be a portion of the channel layer 120 doped with a chalcogen element. For example, when the channel layer 120 is an oxide semiconductor layer, a portion of an upper area of the channel layer 120 may be doped with the chalcogen element. Thus, the chalcogen compound layer 130 may include the portion of the upper area of the channel layer 120 in which an oxide semiconductor compound is doped with the chalcogen element. For example, the mass percentage of the chalcogen element in the chalcogen compound layer 130 may be 5 wt % or more and 20 wt % or less.

In another example, the chalcogen compound layer 130 may include a transition metal dichalcogenide compound. The transition metal dichalcogenide compound may have a crystal structure having an atomic layer thickness on a two-dimensional plane. The transition metal dichalcogenide compound may include one metal element selected from the group consisting of Mo, W, Nb, V, Ta, Ti, Zr, Hf, technetium (Tc), rhenium (Re), Cu, gallium (Ga), indium (In), tin (Sn), germanium (Ge), and lead (Pb) and one chalcogen element selected from the group consisting of sulfur (S), selenium (Se), and tellurium (Te). The chalcogen compound layer 130 may include a two-dimensional transition metal dichalcogenide compound of a monolayer or a multilayer. For example, a two-dimensional transition metal dichalcogenide compound may include at least one atomic layer, and the number of at least one atomic layer may be 1 or more and 10 or less, but the disclosure is not limited thereto.

Although the first electrode 160 and the second electrode 170 are provided on the channel layer 120 at positions spaced apart from each other, the first electrode 160 and the second electrode 170 may not be in contact with the channel layer 120 by the chalcogen compound layer 130. Although the gate dielectric material 140 is provided on the channel layer 120 at positions spaced apart from the first and second electrodes 160 and 170, the gate dielectric material 140 may not be in contact with the channel layer 120 by the chalcogen compound layer 130. Accordingly, the contact resistance decrease and $H_2$ entry into a thin film of the semiconductor device 100 may be mitigated or prevented, and thus device characteristics (e.g., $I_{on}$ (on current), $V_t$ (threshold voltage), and SS (subthreshold swing) values) may be improved and device reliability may be improved.

Figure 2:
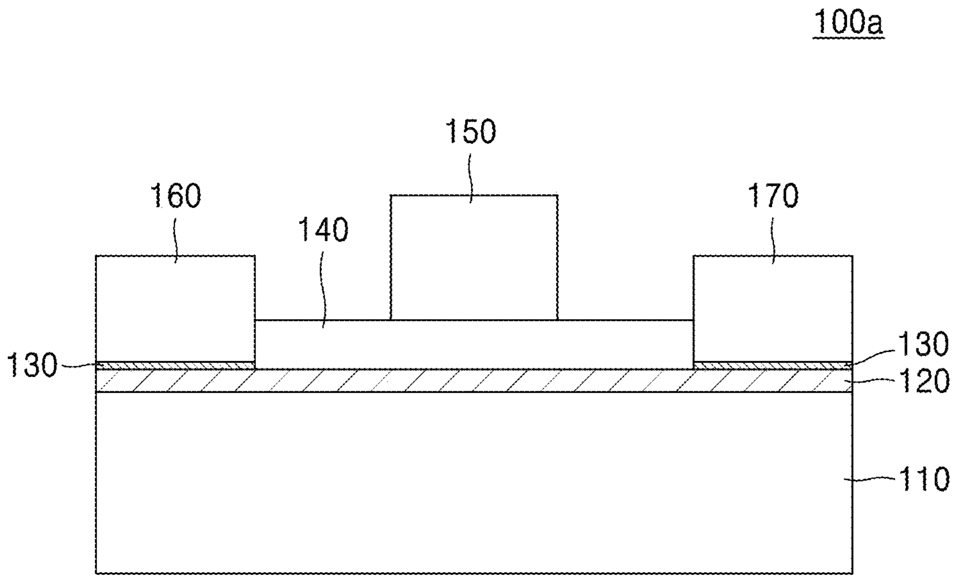
FIG. 2 is a cross-sectional view of a semiconductor device according to an example embodiment.

FIG. 2 is a cross-sectional view of a semiconductor device 100*a* according to an example embodiment.

Only differences from the semiconductor device 100 illustrated in FIG. 1 are described below, and the same reference numerals as those referred to in the semiconductor device 100 of FIG. 1 denote the same elements.

Referring to FIG. 2, the chalcogen compound layer 130, which are portions of the upper portion of the channel layer 120, may be provided in areas between the channel layer 120 and the first electrode 160 and between the channel layer 120 and the second electrode 170.

Figure 3:
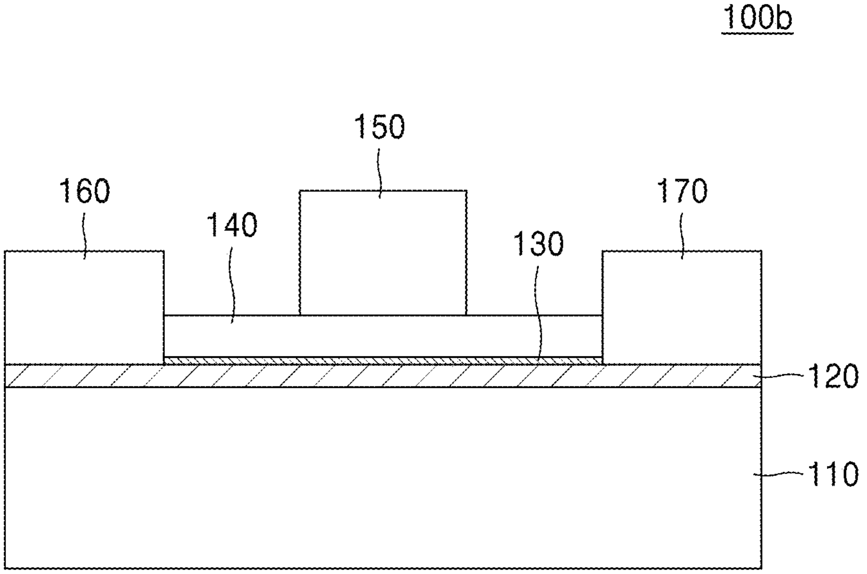
FIG. 3 is a cross-sectional view of a semiconductor device according to an example embodiment.

FIG. 3 is a cross-sectional view of a semiconductor device 100*b* according to an example embodiment.

Only differences from the semiconductor device 100 illustrated in FIG. 1 are described below, and the same reference numerals as those referred to in the semiconductor device 100 denote the same elements.

Referring to FIG. 3, the chalcogen compound layer 130, which is a portion of the upper portion of the channel layer 120, may be provided in an area between the channel layer 120 and the gate dielectric material 140.

Next, a method of manufacturing a semiconductor device according to an example embodiment is described.

FIGS. 4 to 9 are cross-sectional views showing, step by step, a method of manufacturing a semiconductor device, according to an example embodiment.

The manufacturing method illustrated in FIGS. 4 to 9 may be an example of a method of manufacturing the semiconductor device 100. The same reference numerals as those referred to in the semiconductor device 100 denote the same elements, and descriptions thereof are omitted herein.

Figure 4:
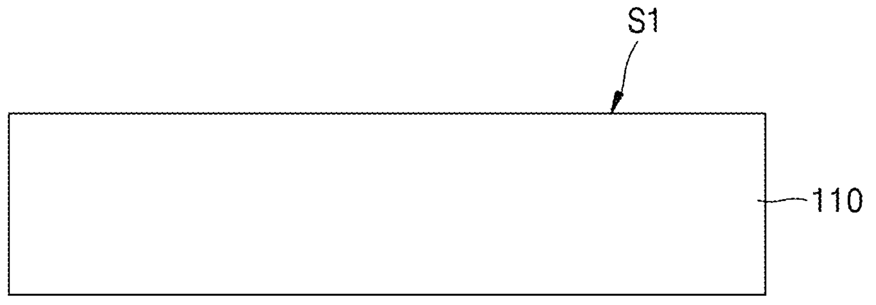
FIGS. 4 to 9 are cross-sectional views showing, step by step, a method of manufacturing a semiconductor device, according to an example embodiment.
Figure 5:
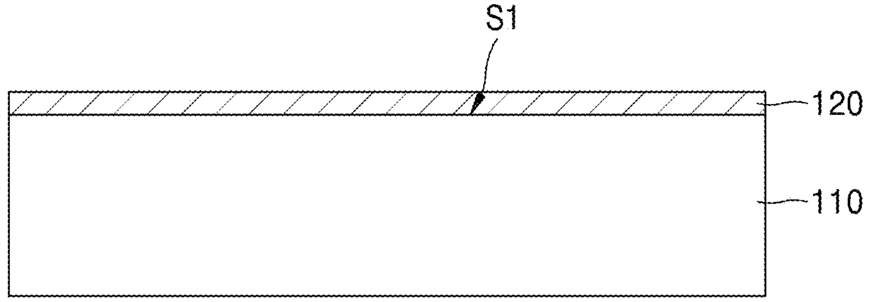
Figure 6:
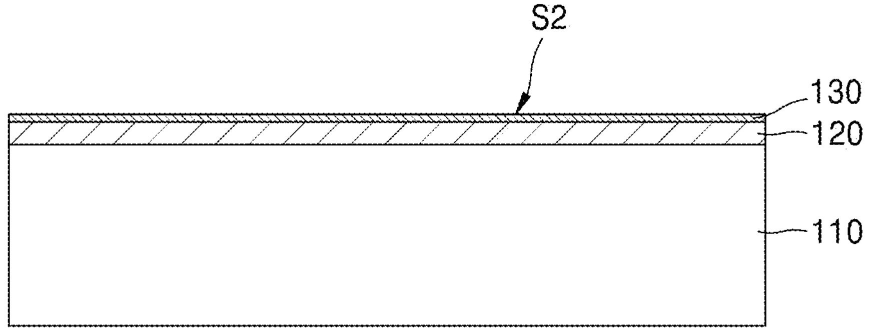
Figure 7:
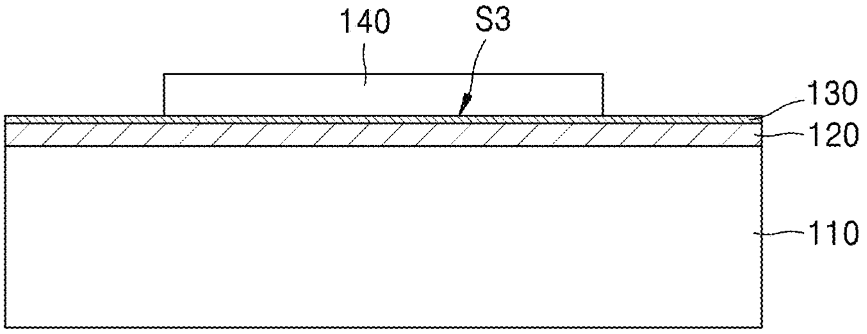
Figure 8:
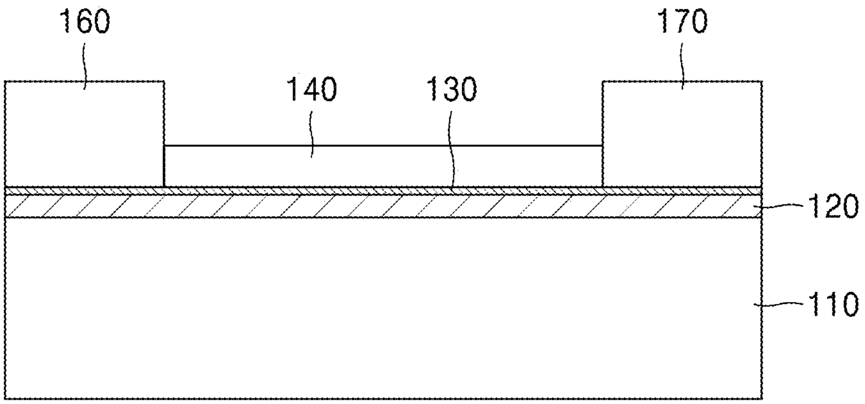
Figure 9:
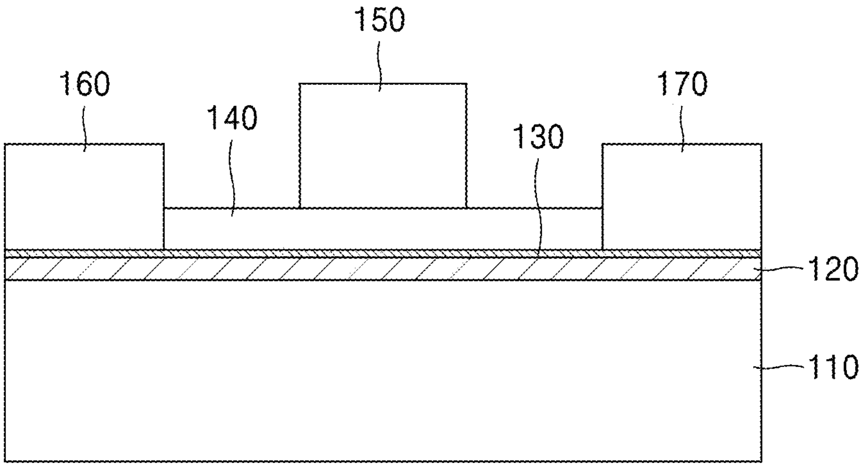

Referring to FIGS. 4 and 5, the channel layer 120 may be formed on a surface S1 of the substrate 110. Referring to FIG. 6, the chalcogen compound layer 130 may be formed on a surface S2 of the channel layer 120. Referring to FIG. 7, the gate dielectric material 140 may be formed on a portion of a surface S3 of the chalcogen compound layer 130. Referring to FIG. 8, the first electrode 160 and the second electrode 170 may be formed in one end and the other end of the chalcogen compound layer 130, respectively, and spaced apart from each other. Referring to FIG. 9, the gate electrode 150 may be formed on the gate dielectric material 140 and spaced apart from the first electrode 160 and the second electrode 170. The first electrode 160, the second electrode 170, and the gate electrode 150 may be simultaneously formed or not. The first electrode 160, the second electrode 170, and the gate electrode 150 may be formed by using various deposition devices used for material layer deposition. For example, a chemical vapor deposition (CVD) device or a physical vapor deposition (PVD) device may be used, or a sputter may be used, but the disclosure is not limited thereto. Although the first electrode 160 and the second electrode 170 are formed on the channel layer 120 to be spaced apart from each other, the first electrode 160 and the second electrode 170 may not be in contact with the channel layer 120 due to the chalcogen compound layer 130. The gate dielectric material 140 may not be in contact with the channel layer 120 due to the chalcogen compound layer 130.

Figure 10:
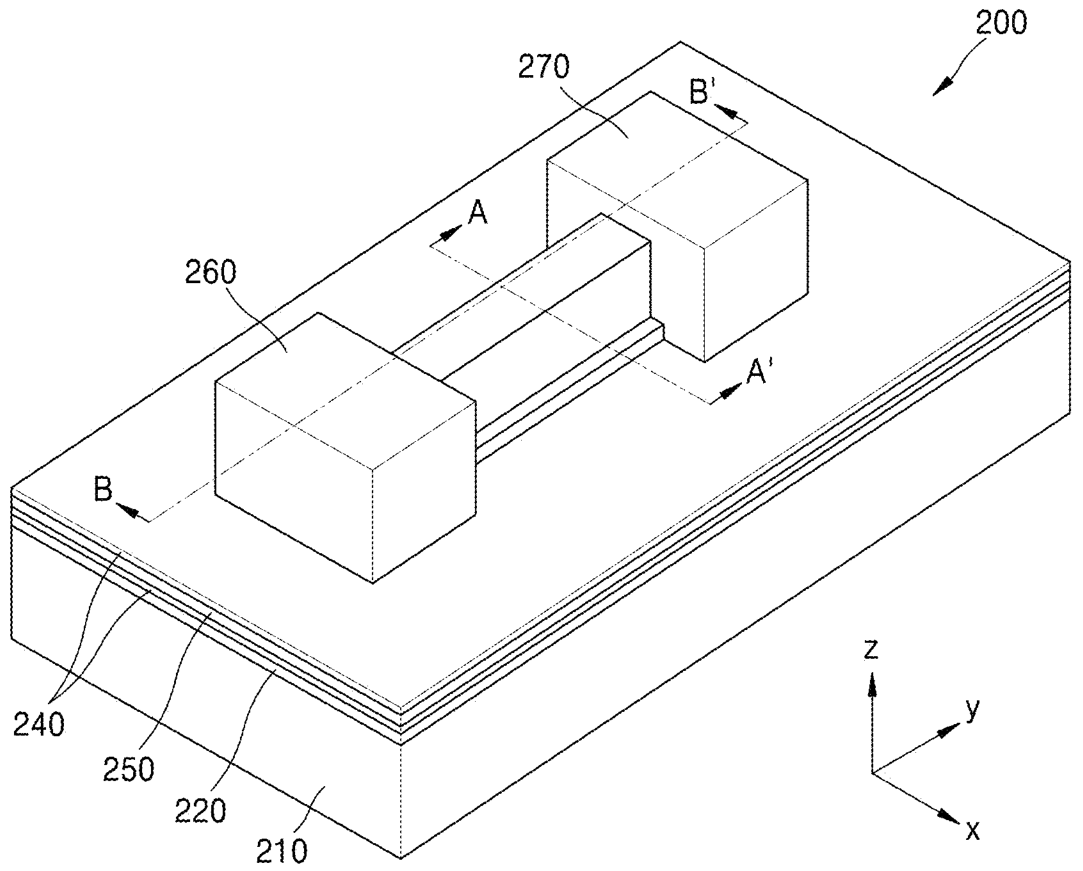
FIG. 10 is a perspective view of a semiconductor device according to an example embodiment.
Figure 11:
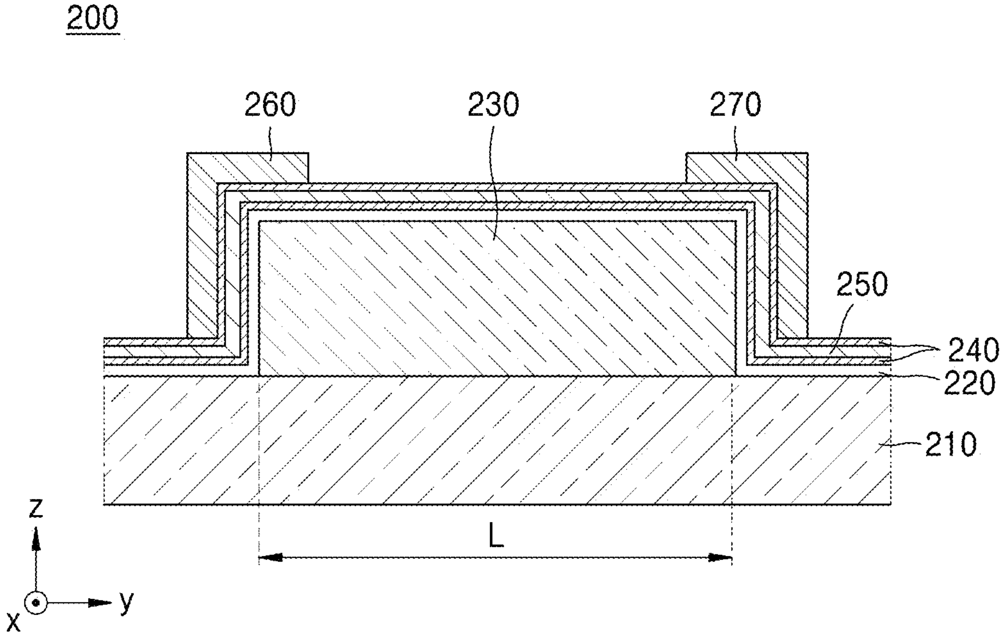
FIG. 11 is a cross-sectional view of the semiconductor device taken along line B-B' of FIG. 10.
Figure 12:
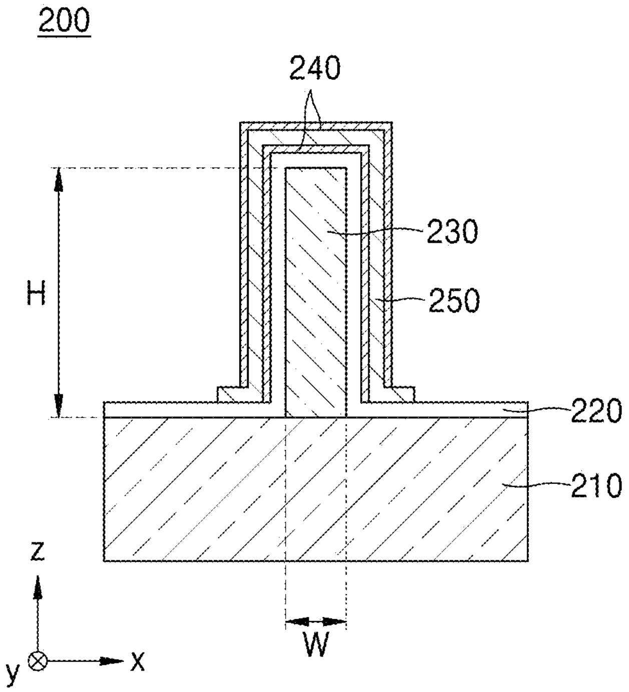
FIG. 12 is a cross-sectional view of the semiconductor device taken along line A-A' of FIG. 10.

FIG. 10 is a perspective view of a semiconductor device 200 according to an example embodiment. FIG. 11 is a cross-sectional view of the semiconductor device 200 taken along line B-B' of FIG. 10, and FIG. 12 is a cross-sectional view of the semiconductor device 200 taken along line A-A' of FIG. 10. The semiconductor device 200 illustrated in FIG. 10 may include a fin field effect transistor (FinFET). Only differences from the semiconductor device 100 illustrated in FIG. 1 are described below.

Referring to FIGS. 10 to 12, the semiconductor device 200 may include a substrate 210, a gate dielectric material 220, a gate electrode 230, a chalcogen compound layer 240, a channel layer 250, a first electrode 260, and a second electrode 270.

The gate electrode 230 may be provided on an upper surface of the substrate 210. The gate electrode 230 may be provided to have a fin shape. The gate electrode 230 may have a width W, a height H, and a length, and FIG. 12 illustrates that the gate electrode 230 has the width W defined in an x-axis direction, the height H defined in a z-axis direction, and the length defined in a y-axis direction.

The gate electrode 230 may have a shape such that the height H is greater than the width W. In other words, the gate electrode 230 may have an aspect ratio, that is, a ratio of the height H to the width W, which is greater than 1. In some example embodiments, the gate electrode 230 has a ratio of the height H to the width W, which is less than about 20. However, the disclosure is not limited thereto.

The gate electrode 230 may have, for example, a rectangular cross-section. In this case, the gate electrode 230 may be arranged substantially perpendicular to a surface of the substrate 210. The expression "substantially perpendicular" means to be accurately perpendicular or almost perpendicular.

The gate dielectric material 220 may be provided on the gate electrode 230. The gate dielectric material 220 may be provided on an upper surface of the substrate 210 to cover a surface of the gate electrode 230. The gate dielectric material 220 may be formed by depositing a certain insulating material on the upper surface of the substrate 210 to cover the gate electrode 230, by using, for example, CVD, atomic layer deposition (ALD), physical vapor physical vapor deposition (PVD), and the like.

The channel layer 250 may be provided on the gate dielectric material 220. The channel layer 250 may be provided on the gate dielectric material 220 covering the gate electrode 230.

The first electrode 260 and the second electrode 270 may be provided in one end and the other end of the channel layer 250, respectively. The first electrode 260 and the second electrode 270 may be electrically connected to the channel layer 250.

The chalcogen compound layer 240 may be provided between the channel layer 250 and the gate dielectric material 220. The chalcogen compound layer 240 may be provided to cover an upper surface of the gate dielectric material 220. Furthermore, the chalcogen compound layer 240 may be provided between the channel layer 250 and each of the first and second electrodes 260 and 270. Although FIG. 11 illustrates that the chalcogen compound layer 240 entirely covers an upper surface of the channel layer 250, in some example embodiments, the chalcogen compound layer 240 may be provided only in areas (interfaces) between each of the first and second electrodes 260 and 270 and the channel layer 250.

Figure 13:
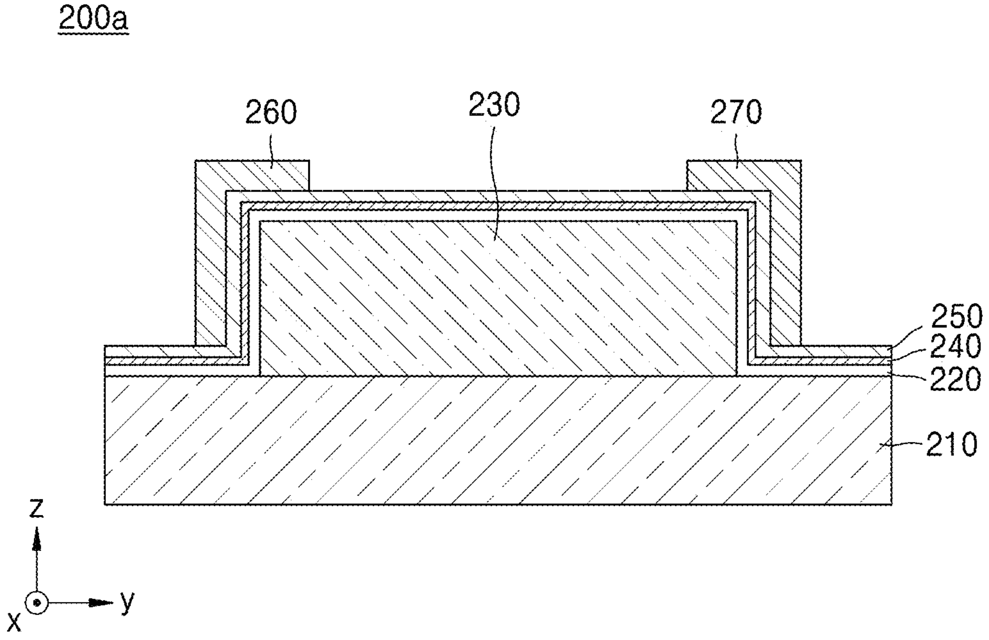
FIGS. 13 and 14 are cross-sectional views of a semiconductor device according to an example embodiment.
Figure 14:
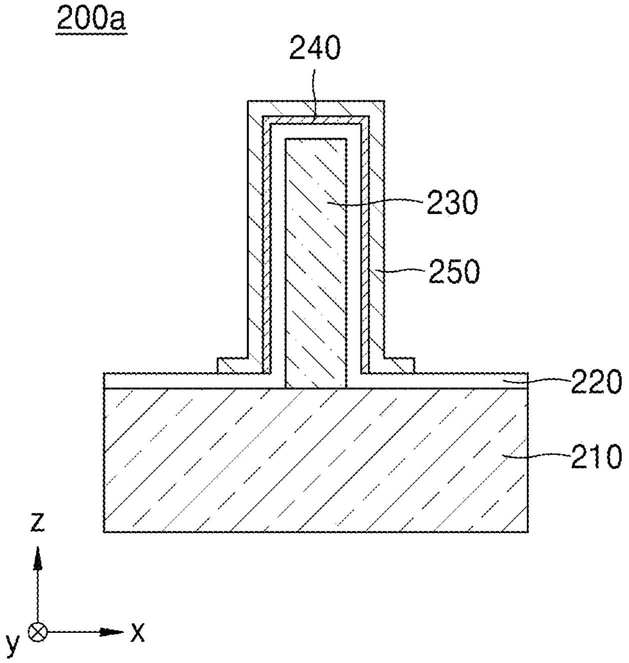

FIGS. 13 and 14 are cross-sectional views of a semiconductor device 200*a* illustrated, according to an example embodiment.

Only differences from the semiconductor device 200 of FIGS. 10 to 12 are described below, and the same reference numerals as those referred to in the semiconductor device 200 denote the same elements.

Referring to FIGS. 13 and 14, the chalcogen compound layer 240 may be only provided between the channel layer 250 and the gate dielectric material 220. The chalcogen compound layer 240 may be provided to cover the upper surface of the gate dielectric material 220.

Figure 15:
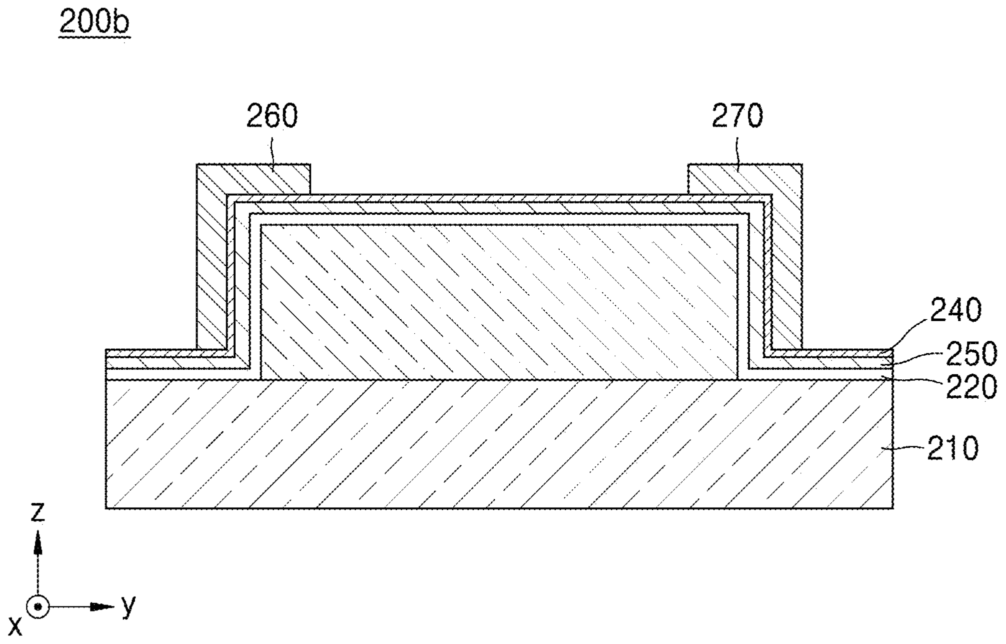
FIGS. 15 and 16 are cross-sectional views of a semiconductor device according to an example embodiment.
Figure 16:
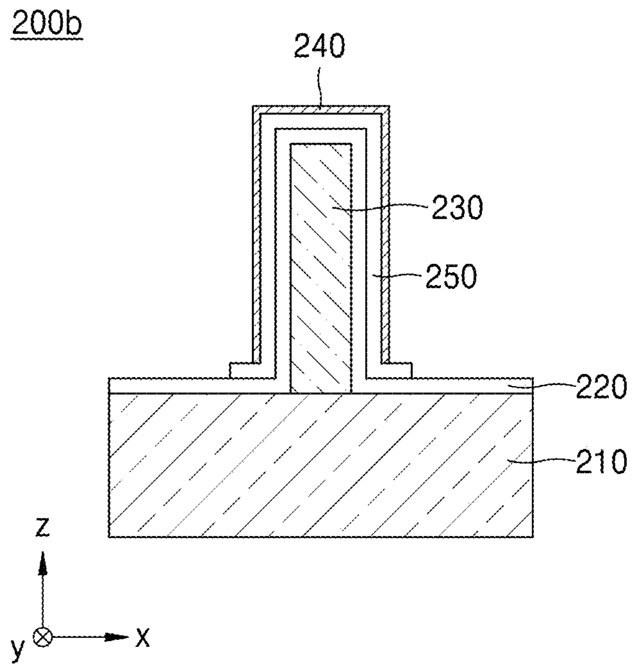

FIGS. 15 and 16 are cross-sectional views of a semiconductor device 200*b* according to an example embodiment.

Only differences from the semiconductor device 200 of FIGS. 10 to 12 are described below, and the same reference numerals as those referred to in the semiconductor device 200 denote the same elements.

Referring to FIGS. 15 and 16, the chalcogen compound layer 240 may be provided between the channel layer 250 and each of the first and second electrodes 260 and 270. Although FIG. 15 illustrates that the chalcogen compound layer 240 entirely covers the upper surface of the channel layer 250, the chalcogen compound layer 240 may be provided in an area (interface) between the channel layer 250 and each of the first and second electrodes 260 and 270.

Figure 17:
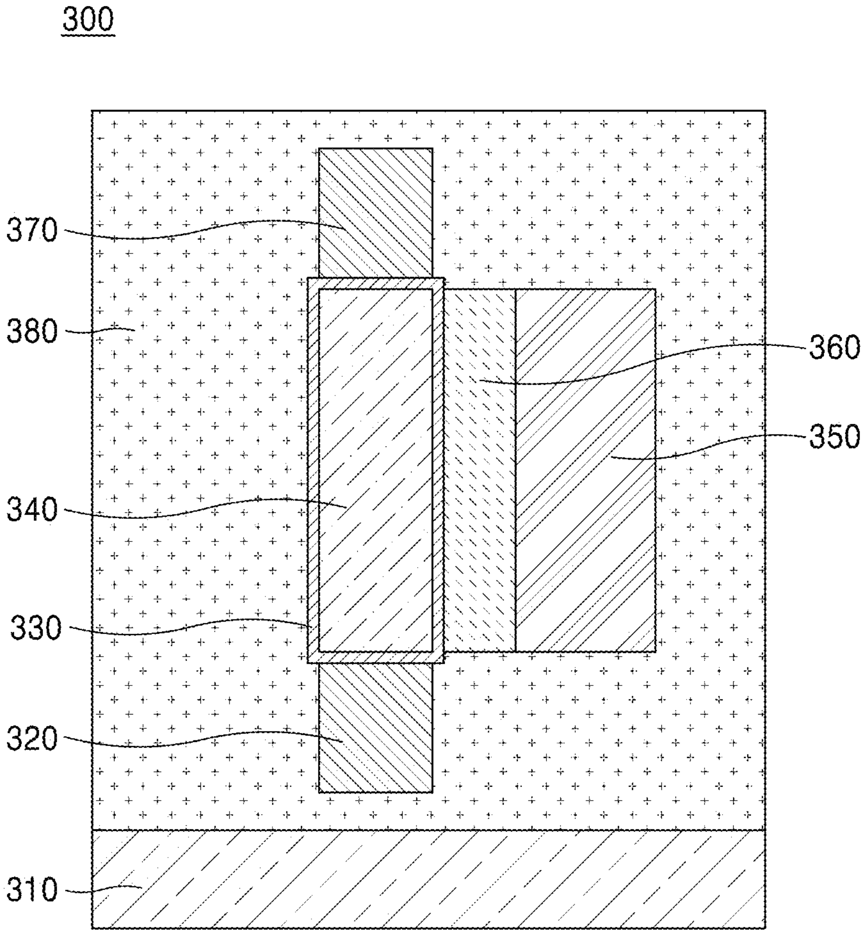
FIG. 17 is a cross-sectional view of a semiconductor device according to an example embodiment.

FIG. 17 is a cross-sectional view of a semiconductor device 300 according to an example embodiment. Only differences from the semiconductor device 100 illustrated in FIG. 1 are described below.

Referring to FIG. 17, the semiconductor device 300 may include a substrate 310, a first electrode 320, a chalcogen compound layer 330, a channel layer 340, a gate electrode 350, a gate dielectric material 360, a second electrode 370, and/or a mold insulating material 380. The semiconductor device 200 illustrated in FIG. 17 may include a vertical channel transistor (VCT).

The substrate 310 may be provided in a plate shape extending along one plane. The z direction may be a direction perpendicular to the substrate 310. As an example, the substrate 310 may include a conductive substrate. The substrate 310 may be an insulating substrate, or a semiconductor substrate having a surface on which an insulating layer is formed.

The first electrode 320 may be disposed on the substrate 310. The first electrode 320 may be located above the substrate 310 and below the channel layer 340. The first electrode 320 may be located in the z direction of the substrate 310. The first electrode 320 may include a metal material. The first electrode 320 may include at least one selected from the group consisting of W, Co, Ni, Fe, Ti, Mo, Cr, Zr, Hf, Nb, Ta, Ag, Au, Al, Cu, Sb, V, Ru, Pt, Zn, and Mg. The first electrode 320 may be in direct contact with the substrate 310, but may be electrically connected to the substrate 310 even if not in contact therewith.

The channel layer 340 may be disposed on the first electrode 320. The channel layer 340 may be located in the z direction of the first electrode 320. The width of the channel layer 340 may be the same as the width of the first electrode 320. The channel layer 340 may extend in a direction in which the substrate 310 and the first electrode 320 are sequentially stacked.

The gate electrode 350 may be arranged to be spaced apart from the channel layer 340. The gate electrode 350 may be arranged to face a portion of or the entirety of the channel layer 340. The channel layer 340, the gate dielectric material 360, and the gate electrode 350 may be stacked in a direction parallel to the substrate 310. In this state, the gate dielectric material 360 may be arranged between the channel layer 340 and the gate electrode 350 and may electrically disconnect the channel layer 340 from the gate electrode 350. The gate dielectric material 360 may include an insulating material. For example, the gate dielectric material 360 may include a dielectric.

The second electrode 370 may be disposed on the channel layer 340. The second electrode 370 may include a metal material. The second electrode 370 may be located on the channel layer 340 in a direction in which the first electrode 320 and the channel layer 340 are sequentially stacked. The second electrode 370 may be located in in the z direction of the channel layer 340. The first electrode 320, the channel layer 340, and the second electrode 370 may be sequentially stacked in a direction perpendicular to the substrate 310.

The chalcogen compound layer 330 may surround the channel layer 340. For example, the chalcogen compound layer 330 may include a first surface between the channel layer 340 and the first electrode 320, a second surface between the channel layer 340 and the second electrode 370, a third surface between the channel layer 340 and the gate dielectric material 360, and a fourth surface located in a direction opposite to the third surface with respect to the channel layer 340.

The mold insulating material 380 may fill an empty space such that the first electrode 320, the chalcogen compound layer 330, the channel layer 340, the second electrode 370, the gate electrode 350, and the gate dielectric material 360 are fixed on the substrate 310. The mold insulating material 380 may include an insulating material.

Figure 18:
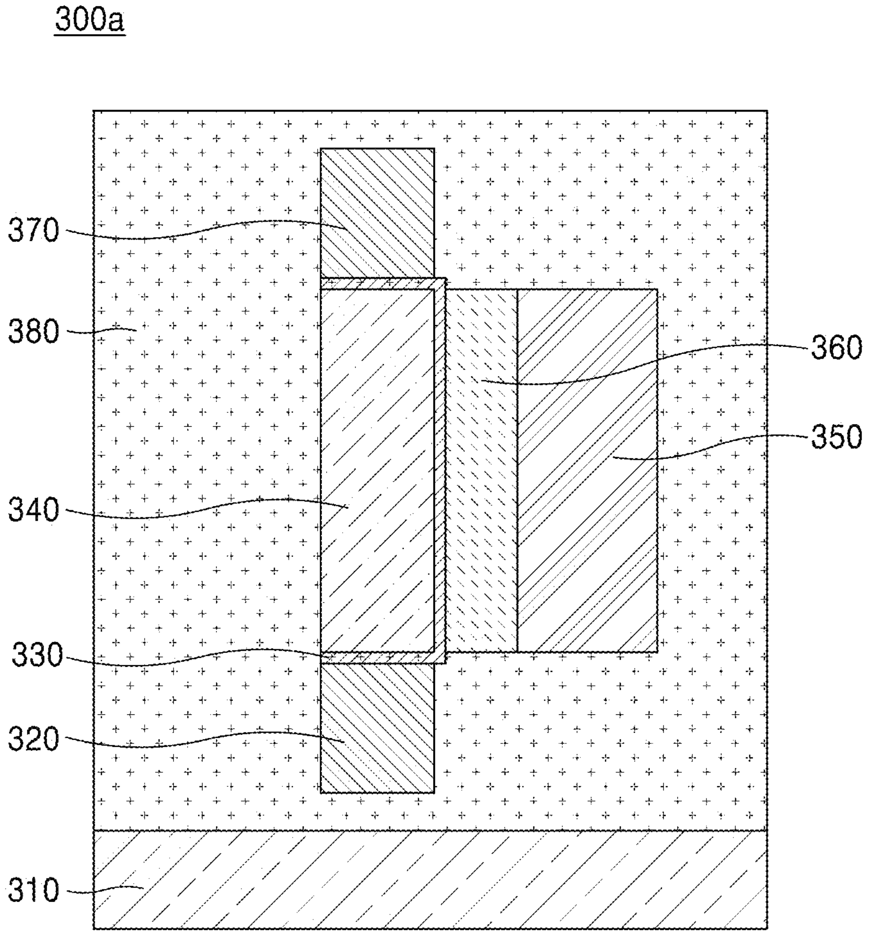
FIG. 18 is a cross-sectional view of a semiconductor device according to an example embodiment.

FIG. 18 is a cross-sectional view of a semiconductor device 300*a* according to an example embodiment.

Only differences from the semiconductor device 300 of FIG. 17 are described below, and the same reference numerals as those referred to in the semiconductor device 300 denote the same elements.

Referring to FIG. 18, the chalcogen compound layer 330 may be provided between the channel layer 340 and the first electrode 320, between the channel layer 340 and the second electrode 370, and between the channel layer 340 and the gate dielectric material 360. For example, the chalcogen compound layer 330 may include a first surface between the channel layer 340 and the first electrode 320, a second surface between the channel layer 340 and the second electrode 370, and a third surface between the channel layer 340 and the gate dielectric material 360.

Figure 19:
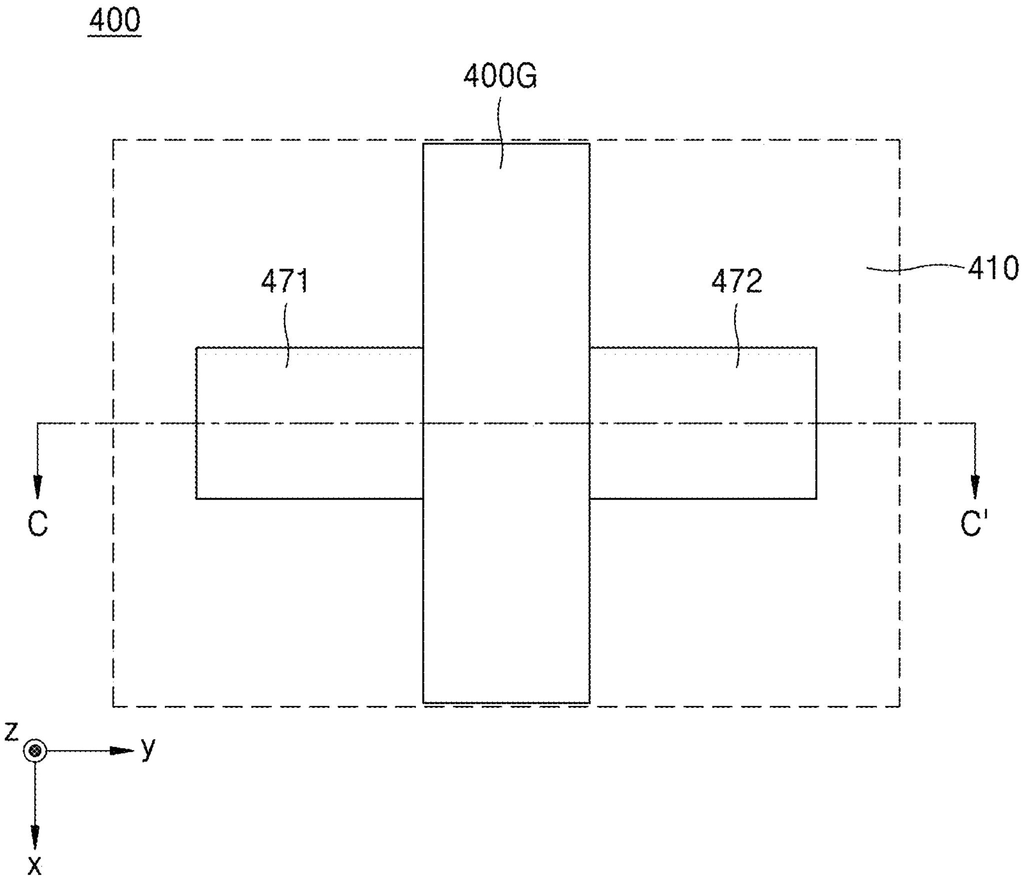
FIG. 19 is a plan view of a semiconductor device according to an example embodiment.
Figure 20:
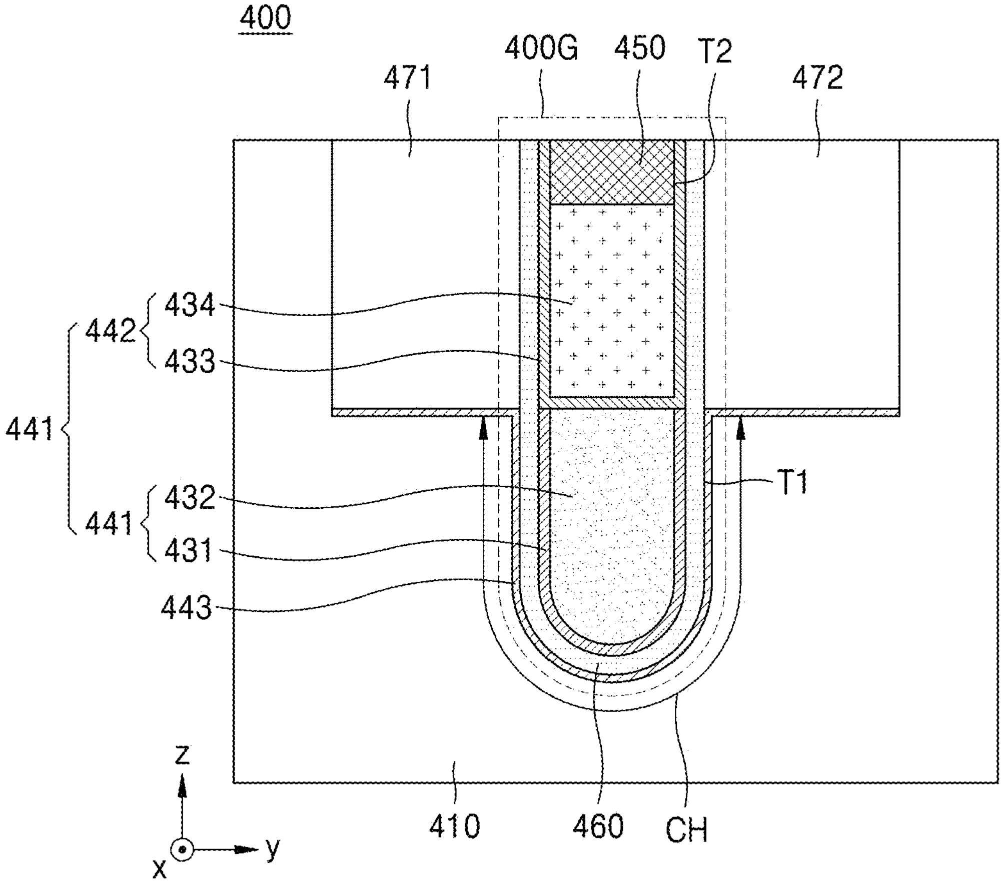
FIG. 20 is a cross-sectional view of the semiconductor device taken along line C-C' of FIG. 19.

FIG. 19 is a plan view of a semiconductor device 400 according to an example embodiment, and FIG. 20 is a cross-sectional view of the semiconductor device 400 taken along line C-C' of FIG. 19. Only differences from the semiconductor device 100 illustrated in FIG. 1 are described below.

Referring to FIGS. 19 and 20, the semiconductor device 400 may include a substrate 410 including a trench T1, a first electrode 471 and a second electrode 472 formed in the substrate 410 and spaced apart from each other by the trench T1, a gate dielectric material 460 covering a bottom surface and side walls of the trench T1, a gate electrode 440 including a lower buried portion 441 provided in the trench T1 to be surrounded by the gate dielectric material 460 and filling a lower portion of the trench T1 and an upper buried portion 442 provided above the lower buried portion 441 to be surrounded by the gate dielectric material 460 and filling an upper portion of the trench T1, and a capping layer 450 provided above the gate electrode 440.

The substrate 410 may include a semiconductor substrate. The substrate 410 may include a material containing silicon.

The trench T1 may be formed in the substrate 410 by etching a portion of the substrate 410 in a vertical direction (z-axis direction).

The first electrode 471 and the second electrode 472 may be formed in the substrate 410 to be spaced apart from each other by the trench T1 in a horizontal direction (y-axis direction). The first electrode 471 and the second electrode 472 may be arranged parallel to the upper portion of the trench T1. For example, upper surfaces of the first electrode 471 and the second electrode 472 and an upper surface of the substrate 410 may be coplanar. Furthermore, lower surfaces of the first electrode 471 and the second electrode 472 may be higher than the bottom surface of the trench T1. Furthermore, the first electrode 471 and the second electrode 472 may be in contact with the side wall of the trench T1.

The first electrode 471 and the second electrode 472 may be formed by doping some portions of the substrate 410 with impurities. For example, the first electrode 471 and the second electrode 472 may be formed by doping some portions of the substrate 410 with any one of phosphorous (P), arsenic (As), Sb, and boron (B) into.

A gate structure 400G may be provided in the trench T1. The gate structure 400G may include the gate electrode 440, the capping layer 450, and the gate dielectric material 460. The gate electrode 440 may partially fill the inside of the trench T1. Accordingly, the gate electrode 440 may be referred to as a buried gate electrode. The capping layer 450 may be provided on the gate electrode 440. The gate dielectric material 460 may be provided to cover the bottom surface and the side wall of the trench T1. For example, the gate electrode 440 may partially fill the inside of the trench T1, and the gate dielectric material 460 may be provided between the substrate 410 and the gate electrode 440 to surround the gate electrode 440. Accordingly, the gate electrode 440 may not be in contact with the bottom surface and side wall of the trench T1.

The gate dielectric material 460 may include an insulating material.

The gate electrode 440 may include the lower buried portion 441 and the upper buried portion 442. The lower buried portion 441 may include a barrier layer 431 and a first conductive layer 432. The barrier layer 431 may be formed to cover the bottom and a lower portion of the side walls of the gate dielectric material 460, inside the trench T1. The first conductive layer 432 may fill the lower portion of the trench T1 and may be surrounded by the barrier layer 431. For example, the first conductive layer 432 may partially fill the lower portion of the inside of the trench T1, and the barrier layer 431 may be provided between the gate dielectric material 460 and the first conductive layer 432 to surround the first conductive layer 432. Furthermore, as the lower buried portion 441 is provided in the lower portion of the inside of the trench T1, the lower buried portion 441 may not overlap the first electrode 471 and the second electrode 472 that are arranged parallel to the upper portion of the trench T1.

When an electric potential is formed between the first electrode 471 and the second electrode 472, a channel CH (or a channel layer) may be formed in the vicinity of the lower buried portion 441 buried in the trench T1.

The barrier layer 431 may include a titanium nitride. For example, the barrier layer 431 may include TiN. The first conductive layer 432 may include a conductive metal material. For example, the first conductive layer 432 may include W. However, the disclosure is not limited thereto, and the first conductive layer 432 may include a metal material other than W.

The upper buried portion 442 may include a buffer layer 433 and a second conductive layer 434. The buffer layer 433 may be formed to cover an upper surface of the first conductive layer 432 and an upper portion of the side walls of the gate dielectric material 460, inside the trench T1. The second conductive layer 434 may fill the upper portion of the trench T1 and may be surrounded by the buffer layer 433. For example, the second conductive layer 434 may partially fill the upper portion of the inside of the trench T1, and the buffer layer 433 may be provided between the gate dielectric material 460 and the second conductive layer 434 to surround the second conductive layer 434. Accordingly, the second conductive layer 434 may not be in contact with the bottom surface and side wall of the gate dielectric material 460. While surrounding the second conductive layer 434, the buffer layer 433 may not cover an upper surface of the second conductive layer 434. Accordingly, the upper surface of the second conductive layer 434 may not be in contact with the buffer layer 433.

The capping layer 450 may be provided on the upper surface of the second conductive layer 434. In this case, the buffer layer 433 may extend to the side surface of the capping layer 450. Accordingly, the side surface of the capping layer 450 may be surrounded by the buffer layer 433. For example, a capping layer trench T2 formed by the upper surface of the second conductive layer 434 and an upper portion of an inner side wall of the buffer layer 433 may be filled with the capping layer 450.

As the buffer layer 433 covers the upper surface of the first conductive layer 432, the lower surface of the second conductive layer 434 surrounded by the buffer layer 433 may not be in contact with the upper surface of the first conductive layer 432. As such, the buffer layer 433 may serve as a barrier between the first conductive layer 432 and the second conductive layer 434. Furthermore, as the upper buried portion 442 is provided on the upper portion of the inside of the trench T1, the upper buried portion 442 may overlap the first electrode 471 and the second electrode 472 arranged parallel to the upper portion of the trench T1 when viewed from a side (e.g., when viewed in the Y-axis direction).

A chalcogen compound layer 443 may be provided between the channel CH and the gate dielectric material 460, between the channel CH and the first electrode 471, and between the channel CH and the second electrode 472. As an example, the chalcogen compound layer 443 may be provided in a lower portion of an outer side wall of the gate dielectric material 460 and a portion of lower surfaces of the first and second electrodes 471 and 472.

Figure 21:
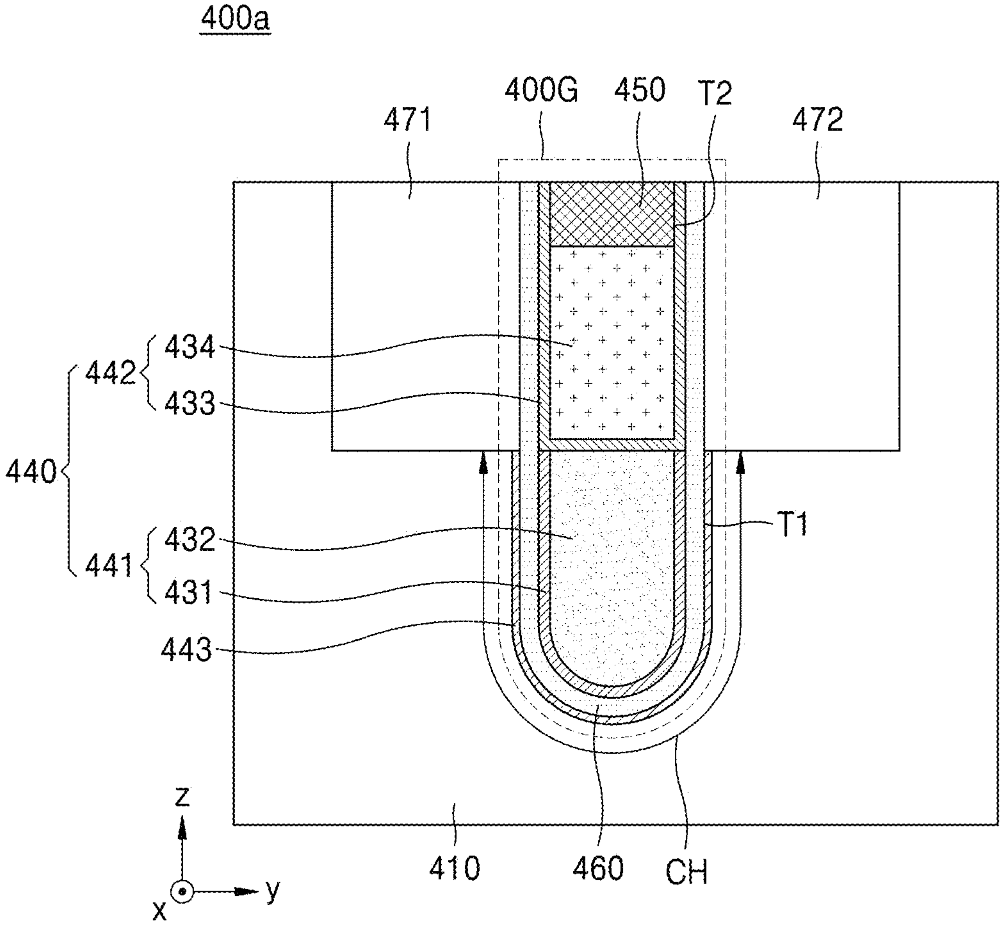
FIG. 21 is a cross-sectional view of a semiconductor device according to an example embodiment.

FIG. 21 is a cross-sectional view of a semiconductor device 400*a* according to an example embodiment. Only differences from the semiconductor device 400 of FIG. 20 are described below, and the same reference numerals as those referred to in the semiconductor device 400 denote the same elements.

Referring to FIG. 21, the chalcogen compound layer 443 may be provided between the channel CH and the gate dielectric material 460. As an example, the chalcogen compound layer 443 may be provided in the lower portion of the outer side wall of the gate dielectric material 460.

Figure 22:
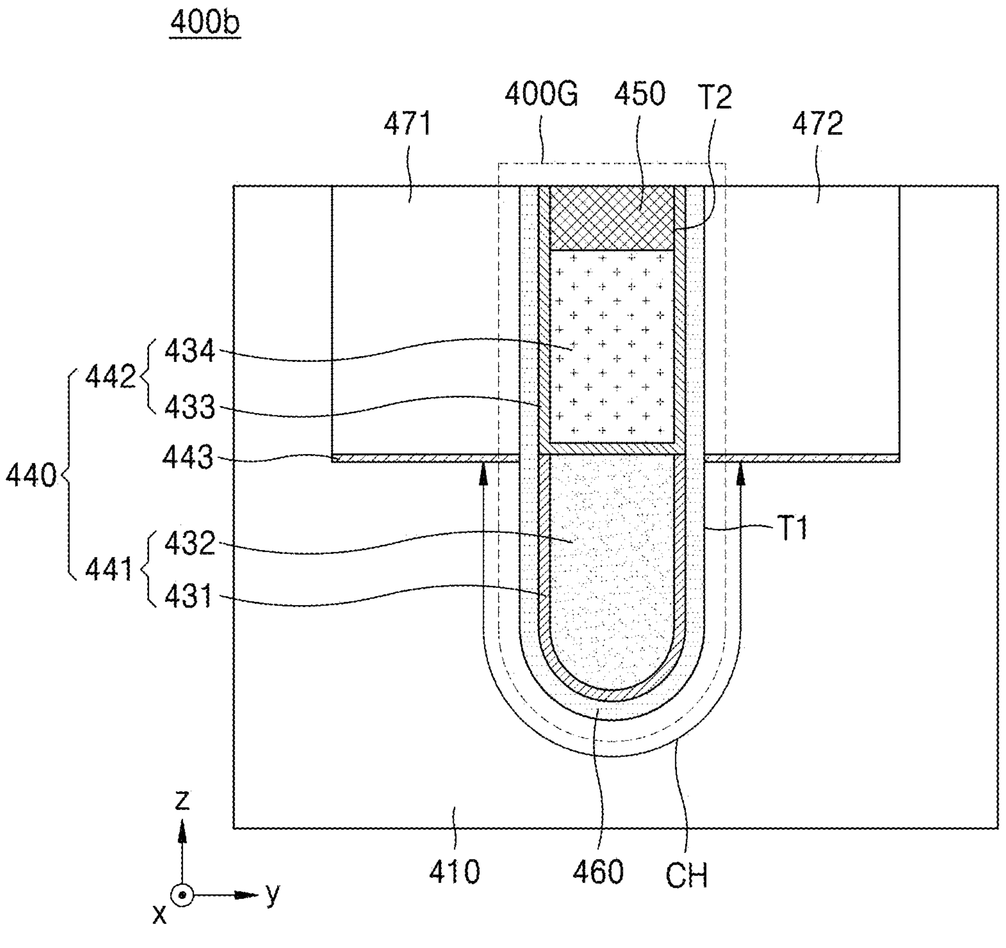
FIG. 22 is a cross-sectional view of a semiconductor device according to an example embodiment.

FIG. 22 is a cross-sectional view of a semiconductor device 400*b* according to an example embodiment. Only differences from the semiconductor device 400 of FIG. 20 are described below, and the same reference numerals as those referred to in the semiconductor device 400 denote the same elements.

Referring to FIG. 22, the chalcogen compound layer 443 may be provided between the channel CH and the first electrode 471 and between the channel CH and the second electrode 472. As an example, the chalcogen compound layer 443 may be provided in portions of lower surfaces of the first and second electrodes 471 and 472, respectively.

Figure 23:
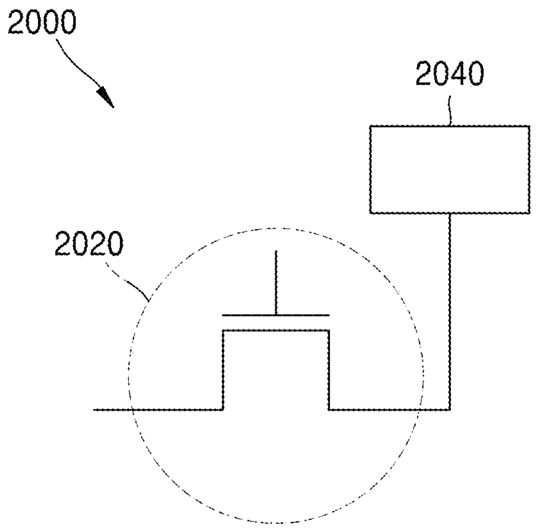
FIG. 23 is a schematic diagram of an electronic element according to an example embodiment.

FIG. 23 illustrates a schematic diagram of an electronic element 2000 according to an example embodiment. In one or more example embodiments, the electronic element 2000 may be a memory device.

Referring to FIG. 23, the electronic element 2000 may include a switching device 2020 and a data storing unit 2040 connected to the switching device 2020. In one or more example embodiments, the switching device 2020 may include a semiconductor device. In one or more example embodiments, the switching device 2020 may include one of semiconductor devices according to the example embodiments described above. In one or more example embodiments, the data storing unit 2040 may include a data storage unit used for volatile or non-volatile memory devices. The data storing unit 2040 may include a capacitor, and may include a magnetic resistance layer or a phase change layer.

Next, electronic apparatuses according to some example embodiments are described below. The electronic apparatuses according to some example embodiments may include semiconductor devices or electronic elements according to the example embodiments described above.

Figure 24:
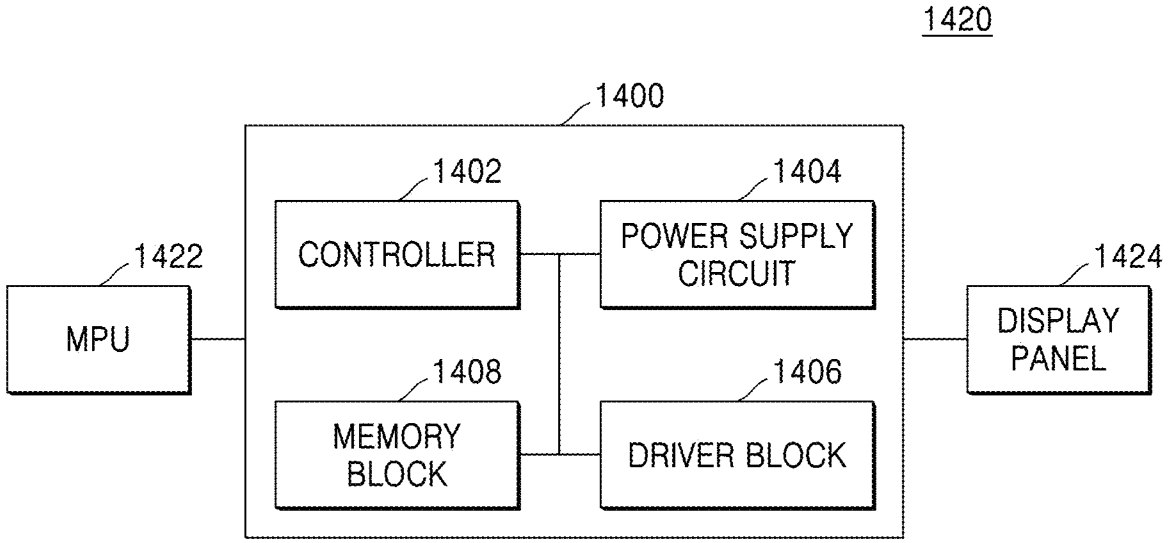
FIGS. 24 to 27 are block diagrams of electronic apparatuses according to some example embodiments.

FIG. 24 is a schematic block diagram of a display driver integrated circuit (IC) (DDI) 1400 and a display device 1420 including the DDI 1400, as an electronic apparatus, according to an example embodiment.

Referring to FIG. 24, the display device 1420 may include a main processing unit (MPU) 1422, the DDI 1400, and the display panel 1424. The DDI 1400 may include a controller 1402, a power supply circuit 1404, a driver block 1406, and a memory block 1408. The controller 1402 receives and decode instructions applied by the MPU 1422, and controls each block of the DDI 1400 to implement an operation according to the instructions. The power supply circuit 1404 may generate a drive voltage in response to the control of the controller 1402. The driver block 1406 drives the display panel 1424 in response to the control of the controller 1402 by using the drive voltage generated by the power supply circuit 1404. The display panel 1424 may be a liquid crystal display panel or a plasma display panel. The memory block 1408, as a block for temporarily storing instructions input to the controller 1402 or control signals output from the controller 1402, or storing desired pieces of data, may include a volatile memory (e.g., RAM) and/or a non-volatile memory. In one or more example embodiments, the controller 1402 may include the electronic element according to one of the example embodiments described above (e.g., the electronic element 2000 of FIG. 23). In one or more example embodiments, the portions and/or blocks included in the DDI 1400 may include a switching device, and the switching device may include one of semiconductor devices according to the embodiments described above.

Figure 25:
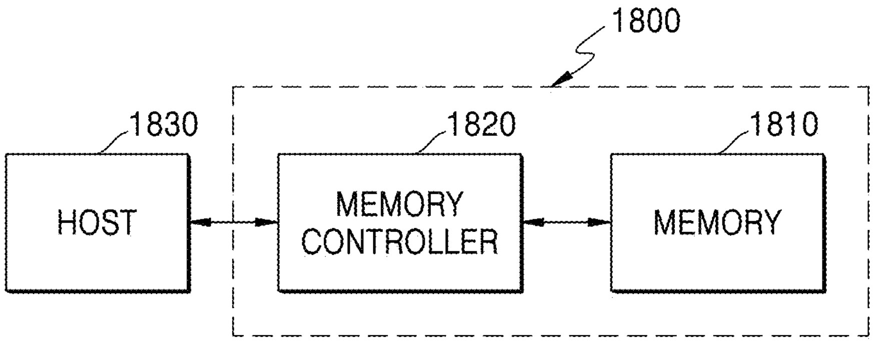

FIG. 25 is a block diagram of an electronic system 1800 as an electronic apparatus according to another embodiment.

Referring to FIG. 25, the electronic system 1800 may include a memory 1810 and a memory controller 1820. The memory controller 1820 may control the memory 1810, in response to a request from a host 1830, for data read out from the memory 1810 and/or data written to the memory 1810.

In one or more example embodiments, the memory 1810 may include an electronic element (e.g., the electronic element 2000 of FIG. 23) according to the example embodiment described above. In one or more example embodiments, the memory 1810 and the memory controller 1820 of the electronic system 1800 may include a switching device, and the switching device may include one of semiconductor devices according to the example embodiments described above.

Figure 26:
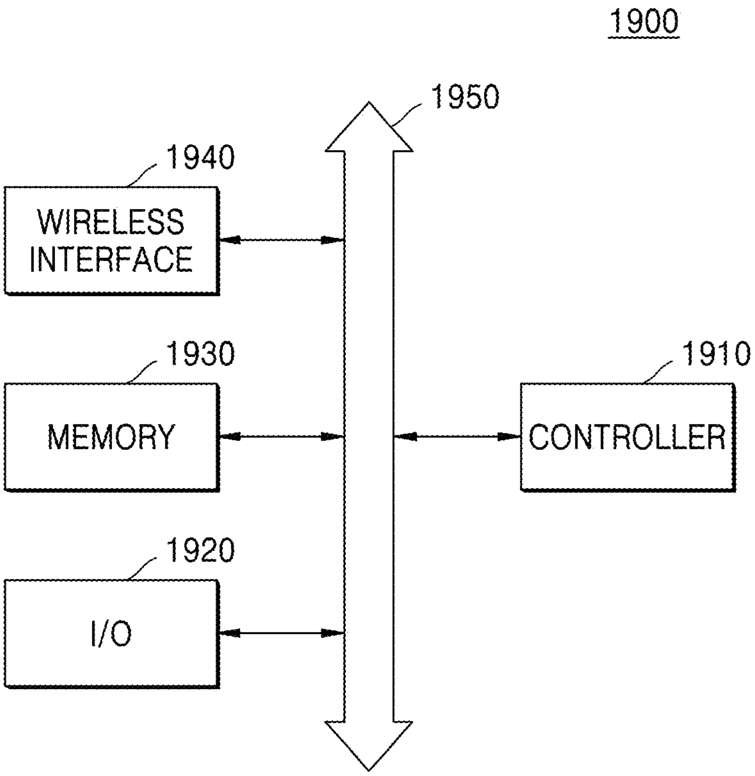

FIG. 26 is a block diagram of an electronic system 1900 as an electronic apparatus according to an example embodiment.

Referring to FIG. 26, the electronic system 1900 may form a wireless communication apparatus or an apparatus capable of transmitting and/or receiving information in a wireless environment. The electronic system 1900 includes a controller 1910, an input/output device (I/O) 1920, a memory 1930, and a wireless interface 1940, which are connected to each other via a bus 1950.

The controller 1910 may include at least one of a microprocessor, a digital signal processor, or a processing device similar thereto. The input/output device 1920 may include at least one of a keypad, a keyboard, or a display.

The memory 1930 may be used to store instructions executed by the controller 1910. For example, the memory 1930 may be used to store user data. In one or more example embodiments, the memory 1930 may include an electronic element (e.g., the electronic element 2000 of FIG. 23) according to one of the example embodiments described above.

In one or more example embodiments, constituent elements 1910, 1920, 1930, and 1940 included in the electronic system 1900 may include a switching device, and the switching device may include one of semiconductor devices according to the embodiment described above.

The electronic system 1900 may use the wireless interface 1940 to transmit/receive data through a wireless communication network. The wireless interface 1940 may include an antenna and/or a wireless transceiver. In some example embodiments, the electronic system 1900 may be used for a communication interface protocol of a third generation communication system, for example, code division multiple access (CDMA), global system for mobile communications (GSM), north American digital cellular (NADC), extended-time division multiple access (E-TDMA), and/or wide band code division multiple access (WCDMA).

Figure 27:
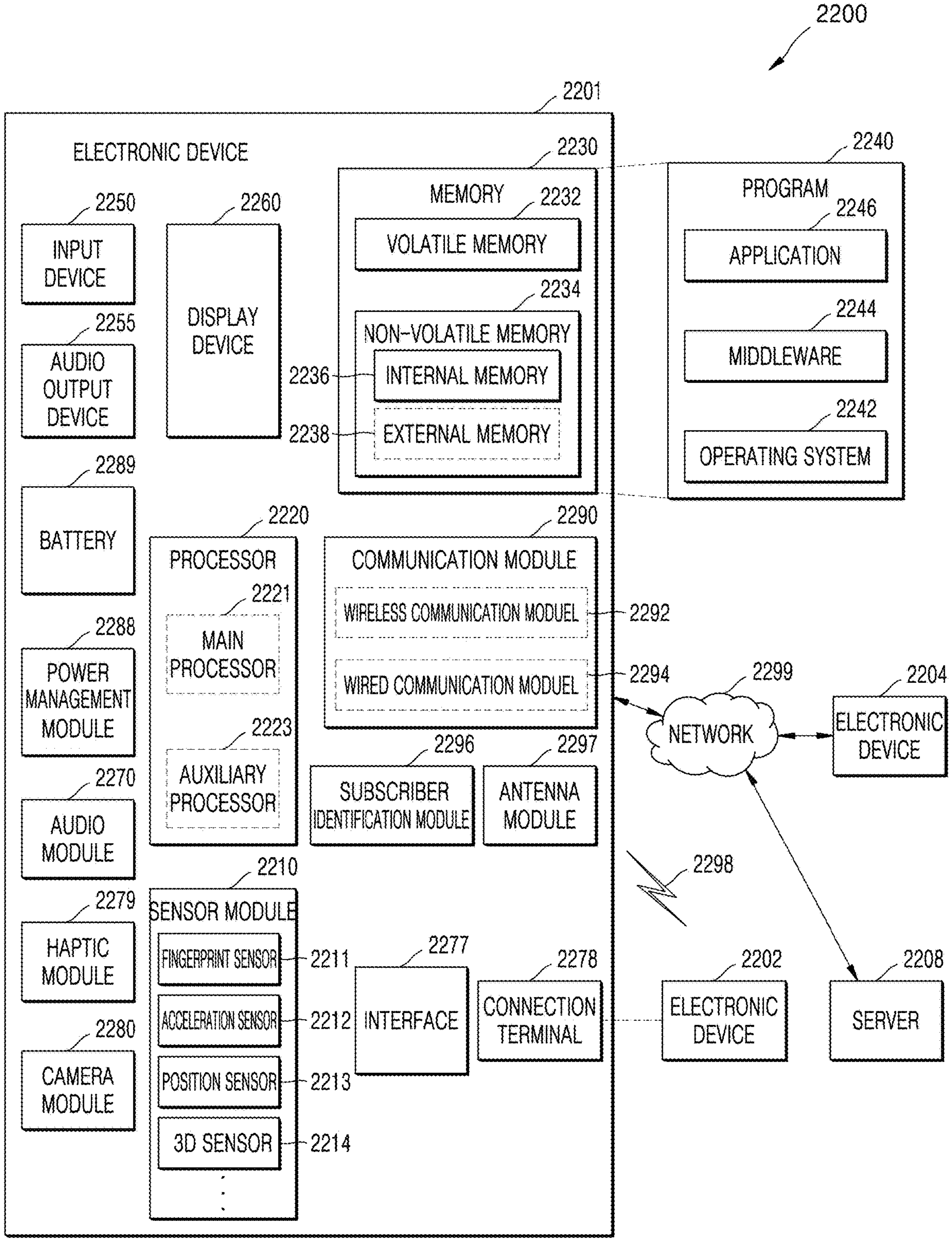

FIG. 27 is a schematic block diagram of an electronic apparatus 2201 according to an example embodiment.

Referring to FIG. 27, in a network environment 2200, the electronic apparatus 2201 may communicate with another electronic device 2202 through a first network 2298 (a short-range wireless communication network and the like), or another electronic device 2204 and/or a server 2208 through a second network 2299 (a long-range wireless communication network and the like). The electronic device 2201 may communicate with the electronic device 2204 through the server 2208. The electronic device 2201 may include a processor 2220, a memory 2230, an input device 2250, an audio output device 2255, a display device 2260, an audio module 2270, a sensor module 2210, an interface 2277, a haptic module 2279, a camera module 2280, a power management module 2288, a battery 2289, a communication module 2290, a subscriber identification module 2296, and/or an antenna module 2297. In the electronic device 2201, some of the constituent elements (the display device 2260 and the like) may be omitted or another constituent element may be added. Some of these constituent elements may be implemented as one integrated circuit. For example, a fingerprint sensor 2211, an iris sensor, an illuminance sensor, and the like of the sensor module 2210 may be implemented by being embedded in the display device 2260 (a display and the like).

The processor 2220 may control, by executing software (a program 2240 and the like), one or a plurality of other constituent elements (a hardware or software constituent element and the like) of the electronic device 2201, and perform various data processing or operations. As part of data processing or operations, the processor 2220 may load commands and/or data received from other constituent elements (the sensor module 2210, the communication module 2290, and the like) in a volatile memory 2232, process the command and/or data stored in the volatile memory 2232, and store resultant data in a non-volatile memory 2234. The processor 2220 may include a main processor 2221 (a central processing unit, an application processor, and the like) and an auxiliary processor 2223 (a graphics processing unit, an image signal processor, a sensor hub processor, a communication processor, and the like), which are operable independently or together. The auxiliary processor 2223 may consume less power than the main processor 2221 and may perform a specialized function.

The auxiliary processor 2223 may control functions and/or states related to some constituent elements (the display device 2260, the sensor module 2210, the communication module 2290, and the like) of the electronic device 2201, instead of the main processor 2221 when the main processor 2221 is in an inactive state (a sleep state), or with the main processor 2221 when the main processor 2221 is in an active state (an application execution state). The auxiliary processor 2223 (an image signal processor, a communication processor, and the like) may be implemented as a part of functionally related other constituent elements (the camera module 2280, the communication module 2290, and the like).

The memory 2230 may store various pieces of data needed for constituent element (the processor 2220, the sensor module 2210, and the like) of the electronic device 2201. The data may include, for example, software (the program 2240 and the like) and input data and/or output data regarding commands related thereto. The memory 2230 may include the volatile memory 2232 and/or the non-volatile memory 2234. The non-volatile memory 2234 may include an internal memory 2236 and an external memory 2238. In one or more example embodiments, the memory 2230 may include an electronic element (e.g., the electronic element 2000 of FIG. 23) according to one of the example embodiments described above.

The program 2240 may be stored software in the memory 2230 as software, and may include an operating system 2242, a middleware 2244, and/or an application 2246.

The input device 2250 may receive instructions and/or data to be used for the constituent elements (the processor 2220 and the like) of the electronic apparatus 2201 from the outside (a user and the like) of the electronic apparatus 2201. The input device 2250 may include a microphone, a mouse, a keyboard, and/or a digital pen (a stylus pen and the like).

The audio output device 2255 may output an audio signal to the outside of the electronic device 2201. The audio output device 2255 may include a speaker and/or a receiver. The speaker may be used for general purposes such as multimedia playback or recording playback, and the receiver may be used to receive incoming calls. The receiver may be combined as a part of the speaker or implemented as an independent separate device.

The display device 2260 may visually provide information to the outside of the electronic device 2201. The display device 2260 may include a display, a hologram device, or a projector, and a control circuit for controlling such a device. The display device 2260 may include a touch circuitry set to sense a touch, and/or a sensor circuit (a pressure sensor and the like) set to measure the strength of a force generated by the touch.

The audio module 2270 may convert sound into an electrical signal or reversely an electrical signal into sound. The audio module 2270 may obtain sound through the input device 2250, or output sound through the audio output device 2255 and/or a speaker and/or a headphone of another electronic device (the electronic device 2202 and the like) connected to the electronic device 2201 in a wired or wireless manner.

The sensor module 2210 may sense an operation state (power, a temperature, and the like) of the electronic device 2201, or an external environment state (a user state and the like), and generate an electrical signal and/or data value corresponding to a sensed state. The sensor module 2210 may include the fingerprint sensor 2211, an acceleration sensor 2212, a position sensor 2213, a 3D sensor 2214, and the like, and further include an iris sensor, a gyro sensor, a barometric pressure sensor, a magnetic sensor, a grip sensor, a proximity sensor, a color sensor, an infrared (IR) sensor, a biometric sensor, a temperature sensor, a humidity sensor, and/or an illuminance sensor.

The 3D sensor 2214 may sense a shape, a movement, and the like of an object by irradiating light to the object and analyzing light reflected from the object, and may include any one of the phase modulators.

The interface 2277 may support one or more designated protocols to be used for connecting the electronic device 2201 to another electronic device (the electronic device 2202 and the like) in a wired or wireless manner. The interface 2277 may include a high definition multimedia interface (HDMI), a universal serial bus (USB) interface, an SD card interface, and/or an audio interface.

A connection terminal 2278 may include a connector for physically connecting the electronic device 2201 to another electronic device (the electronic device 2202 and the like). The connection terminal 2278 may include an HDMI connector, a USB connector, an SD card connector, and/or an audio connector (a headphone connector and the like).

The haptic module 2279 may convert electrical signals into mechanical stimuli (vibrations, movements, and the like) or electrical stimuli that are perceivable by a user through tactile or motor sensations. The haptic module 2279 may include a motor, a piezoelectric device, and/or an electrical stimulation device.

The camera module 2280 may capture a still image and a video. The camera module 2280 may include a lens assembly including one or a plurality of lenses, image sensors, image signal processors, and/or flashes. The lens assembly included in the camera module 2280 may collect light emitted from an object that is a target for image capturing.

The power management module 2288 may manage power supplied to the electronic device 2201. The power management module 2288 may be implemented as a part of a power management integrated circuit (PMIC).

The battery 2289 may supply power to the constituent elements of the electronic device 2201. The battery 2289 may include non-rechargeable primary cells, rechargeable secondary cells, and/or fuel cells.

The communication module 2290 may establish a wired communication channel and/or a wireless communication channel between the electronic device 2201 and another electronic device (the electronic device 2202, the electronic device 2204, the server 2208, and the like), and support a communication through an established communication channel. The communication module 2290 may be operated independently of the processor 2220 (the application processor and the like), and may include one or a plurality of communication processors supporting a wired communication and/or a wireless communication. The communication module 2290 may include a wireless communication module 2292 (a cellular communication module, a short-range wireless communication module, a global navigation satellite system (GNSS) communication module, and the like), and/or a wired communication module 2294 (a local area network (LAN) communication module, a power line communication module, and the like). Among the above communication modules, a corresponding communication module may communicate with another electronic device through the first network 2298 (a short-range communication network such as Bluetooth, Wi-Fi Direct, or infrared data association (IrDA)) or the second network 2299 (a long-range communication network such as a cellular network, the Internet, or a computer network (LAN, WAN, and the like)). These various types of communication modules may be integrated into one constituent element (a single chip and the like), or may be implemented as a plurality of separate constituent elements (multiple chips). The wireless communication module 2292 may verify and authenticate the electronic device 2201 in a communication network such as the first network 2298 and/or the second network 2299 by using subscriber information (an international mobile subscriber identifier (IMSI), and the like) stored in the subscriber identification module 2296.

The antenna module 2297 may transmit signals and/or power to the outside (another electronic device and the like) or receive signals and/or power from the outside. An antenna may include an emitter formed in a conductive pattern on a substrate (a printed circuit board (PCB) and the like). The antenna module 2297 may include one or a plurality of antennas. When the antenna module 2297 includes a plurality of antennas, the communication module 2290 may select, from among the antennas, an appropriate antenna for a communication method used in a communication network such as the first network 2298 and/or the second network 2299. Signals and/or power may be transmitted or received between the communication module 2290 and another electronic device through the selected antenna. Other parts (an RFIC and the like) than the antenna may be included as a part of the antenna module 2297.

Some of the constituent elements may be connected to each other through a communication method between peripheral devices (a bus, general purpose input and output (GPIO), a serial peripheral interface (SPI), a mobile industry processor interface (MIPI), and the like) and may mutually exchange signals (commands, data, and the like).

The command or data may be transmitted or received between the electronic device 2201 and the external electronic device 2204 through the server 2208 connected to the second network 2299. The electronic devices 2202 and 2204 may be of a type that is the same as or different from the electronic device 2201. All or a part of operations executed in the electronic device 2201 may be executed in one or a plurality of the electronic devices (2202, 2204, and 2208). For example, when the electronic device 2201 needs to perform a function or service, the electronic device 2201 may request one or a plurality of electronic devices to perform part of the whole of the function or service, instead of performing the function or service. The one or a plurality of the electronic devices receiving the request may perform additional function or service related to the request, and transmit a result of the performance to the electronic device 2201. To this end, cloud computing, distributed computing, and/or client-server computing technology may be used.

In the network environment 2200, at least the electronic apparatus 2201 may include a switching device (e.g., a semiconductor device), and the switching device may include one of semiconductor devices according to the example embodiments described above.

In the semiconductor device described above, as an example, in a manufacturing process, the chalcogen compound layer is formed between the channel layer and the gate stack and between the channel layer and the electrode. Due to the chalcogen compound layer, the channel layer may not be in direct contact with the gate stack and the electrode. Accordingly, the contact resistance decrease and the entry of $H_2$ into a thin film of the semiconductor device may be mitigated or prevented, the device characteristics (e.g., $I_{on}$ (on current), $V_t$ (threshold voltage), and SS (Subthreshold Swing) values) may be improved, and device reliability may be improved. Accordingly, the operation characteristics of the semiconductor device according to one of the example embodiments described above, and an apparatus including the same, may be improved.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Any or all of the elements described with reference to FIG. 27 may communicate with any or all other elements described with reference to FIG. 27. For example, any element may engage in one-way and/or two-way and/or broadcast communication with any or all other elements in FIG. 27, to transfer and/or exchange and/or receive information such as but not limited to data and/or commands, in a serial and/or parallel manner, via a wireless and/or a wired bus (not illustrated). The information may be in encoded various formats, such as in an analog format and/or in a digital format.

It should be understood that the example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A semiconductor device comprising:

a substrate;

a channel layer on the substrate;

a first electrode and a second electrode on two opposite ends of the channel layer, respectively, and spaced apart from each other;

a gate electrode on the channel layer and spaced apart from the first electrode and the second electrode;

a gate dielectric material between the channel layer and the gate electrode; and a chalcogen compound layer being at least one of between the gate dielectric material and the channel layer, between the first electrode and the channel layer, and between the second electrode and the channel layer, wherein the channel layer includes an oxide semiconductor compound, and wherein the chalcogen compound layer includes the oxide semiconductor compound doped with a chalcogen element.

2. The semiconductor device of claim 1, wherein the channel layer comprises at least one of indium (In), zinc (Zn), tin (Sn), gallium (Ga), and hafnium (Hf).

3. The semiconductor device of claim 1, wherein a mass percentage of the chalcogen element in the chalcogen compound layer is 5 wt % or more and 20 wt % or less.

4. A semiconductor device comprising:

a substrate;

a channel layer on the substrate;

a first electrode and a second electrode on two opposite ends of the channel layer, respectively, the first electrode and the second electrode being spaced apart from each other;

a gate electrode on the channel laver, the gate electrode being spaced apart from the first electrode and the second electrode;

a gate dielectric material between the channel layer and the gate electrode; and a chalcogen compound layer being at least one of between the gate dielectric material and the channel layer, between the first electrode and the channel layer, and between the second electrode and the channel layer, wherein the channel layer includes an oxide semiconductor compound, and wherein the chalcogen compound layer comprises the oxide semiconductor compound and a two-dimensional transition metal dichalcogenide compound.

5. The semiconductor device of claim 4, wherein the two-dimensional transition metal dichalcogenide compound comprises:

one metal element selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb); and one chalcogen element selected from the group consisting of sulfur(S), selenium (Se), and tellurium (Te).

6. The semiconductor device of claim 4, wherein the two-dimensional transition metal dichalcogenide compound comprises at least one atomic layer, and a number of the at least one atomic layer is 1 or more and 10 or less.

7. The semiconductor device of claim 1, wherein a thickness of the chalcogen compound layer is 1 nm or more and 5 nm or less.

8. The semiconductor device of claim 1, wherein the channel layer, the gate dielectric material, and the gate electrode are stacked in a direction perpendicular to the substrate.

9. The semiconductor device of claim 1, wherein the gate electrode has a shape in which a height is greater than a width.

10. The semiconductor device of claim 1, wherein the channel layer, the gate dielectric material, and the gate electrode are stacked in a direction parallel to the substrate.

11. The semiconductor device of claim 1, wherein the substrate includes a trench, the gate dielectric material covers a bottom surface and side walls of the trench, and the gate electrode is surrounded by the gate dielectric material in the trench.

12. A method of manufacturing a semiconductor device, the method comprising:

forming a channel layer in a substrate, the channel layer being an oxide semiconductor compound;

forming a chalcogen compound layer in the channel layer by doping the oxide semiconductor compound at an upper area of the channel layer with a chalcogen element;

forming a gate dielectric material;

forming a first electrode and a second electrode spaced apart from each other; and forming a gate electrode on the gate dielectric material to be spaced apart from the first electrode and the second electrode, wherein the chalcogen compound layer is formed at least one of between the gate dielectric material and the channel layer, between the first electrode and the channel layer, and between the second electrode and the channel layer.

13. The method of claim 12, wherein the channel layer comprises at least one of indium (In), zinc (Zn), tin (Sn), gallium (Ga), and hafnium (Hf).

14. The method of claim 12, wherein a mass percentage of the chalcogen element in the chalcogen compound layer is 5 wt % or more and 20 wt % or less.

15. The method of claim 12, wherein a thickness of the chalcogen compound layer is 1 nm or more and 5 nm or less.

* * * * *